United States Patent
Ito et al.

(10) Patent No.: US 7,215,372 B2
(45) Date of Patent: May 8, 2007

(54) OPTICAL APPARATUS HAVING DUST OFF FUNCTION

(75) Inventors: Junichi Ito, Fuchu (JP); Hiroyuki Takizawa, Chofu (JP); Masataka Ide, Hachioji (JP); Sumio Kawai, Hachioji (JP)

(73) Assignee: Olympus Corporation, Tokyo (JP)

( * ) Notice: Subject to any disclaimer, the term of this patent is extended or adjusted under 35 U.S.C. 154(b) by 777 days.

(21) Appl. No.: 10/242,312

(22) Filed: Sep. 12, 2002

(65) Prior Publication Data

US 2003/0214599 A1   Nov. 20, 2003

(30) Foreign Application Priority Data

May 17, 2002   (JP)   .............................. 2002-142701
May 17, 2002   (JP)   .............................. 2002-142702
Jun. 21, 2002   (JP)   .............................. 2002-181754

(51) Int. Cl.
H04N 5/225   (2006.01)

(52) U.S. Cl. ....................................... 348/340; 348/374

(58) Field of Classification Search ..................... None
See application file for complete search history.

(56) References Cited

U.S. PATENT DOCUMENTS

| | | | |
|---|---|---|---|
| 4,387,973 A | 6/1983 | Martin | |
| 4,441,796 A | 4/1984 | Shaw | |
| 4,841,387 A | 6/1989 | Rindfuss | |
| 4,920,420 A | 4/1990 | Sano et al. | |
| 5,170,288 A * | 12/1992 | Imaizumi et al. | ........... 359/507 |
| 5,910,700 A | 6/1999 | Crotzer | |
| 6,047,134 A * | 4/2000 | Sekine et al. | ................. 396/55 |
| 6,078,438 A | 6/2000 | Shibata et al. | |

(Continued)

FOREIGN PATENT DOCUMENTS

JP   57-078032   5/1982

(Continued)

OTHER PUBLICATIONS

Machine translation of Japanese Published Application 2001-298640.*

(Continued)

*Primary Examiner*—Ngoc-Yen Vu
*Assistant Examiner*—Dillon Durnford-Geszvain
(74) *Attorney, Agent, or Firm*—Straub and Pokotylo; John C. Pokotylo

(57) ABSTRACT

An optical apparatus (camera) having dust-off function comprises a dust-off glass (optical element) located between an image-pickup element and optical system (lens) for forming an image on the light receiving surface of the element. A camera includes a mechanism (piezoelectric element and drive circuit) that controls vibrating operation so that the frequency of vibration waves generated in the glass changes with the passage of time. A camera includes first vibrator (piezoelectric element) for successive vibration with frequencies, a circuit monitoring the state of vibration of the optical element during vibrating operation of the first vibrator, thereby detecting the resonance frequency of the element, and second vibrator (piezoelectric element) for vibration with the detected resonance frequency or a frequency approximate to it. A camera includes monitor (electrode) for monitoring the state of vibration of the glass and a circuit for detecting abnormal states in accordance with output signals from the electrode.

35 Claims, 27 Drawing Sheets

U.S. PATENT DOCUMENTS

| | | | |
|---|---|---|---|
| 6,163,340 | A | 12/2000 | Yasuda |
| 6,590,613 | B2 | 7/2003 | Yasuda |
| 6,819,358 | B1 * | 11/2004 | Kagle et al. ............... 348/246 |
| 2001/0053288 | A1 | 12/2001 | Ito et al. |
| 2002/0171751 | A1 | 11/2002 | Ohkawara |
| 2003/0146980 | A1 | 8/2003 | Shimada |
| 2003/0202114 | A1 | 10/2003 | Takizawa et al. |
| 2003/0214588 | A1 | 11/2003 | Takizawa et al. |
| 2003/0218685 | A1 | 11/2003 | Kawai |
| 2004/0012714 | A1 | 1/2004 | Kawai |
| 2004/0047625 | A1 | 3/2004 | Ito et al. |
| 2004/0090549 | A1 | 5/2004 | Takizawa et al. |
| 2004/0169761 | A1 | 9/2004 | Kawai et al. |
| 2004/0227837 | A1 | 11/2004 | Ito |
| 2004/0263669 | A1 | 12/2004 | Kobayashi |
| 2005/0088563 | A1 | 4/2005 | Ito et al. |

FOREIGN PATENT DOCUMENTS

| | | |
|---|---|---|
| JP | 62-165127 | 7/1987 |
| JP | 01-230016 | 9/1989 |
| JP | 03-244281 | 10/1991 |
| JP | 04-081253 | 3/1992 |
| JP | 05213286 | 8/1993 |
| JP | 07-151946 | 6/1995 |
| JP | 07-322153 | 12/1995 |
| JP | 08-079633 | 3/1996 |
| JP | 08-28579 | 11/1996 |
| JP | 09-130654 | 5/1997 |
| JP | 2000-330054 | 11/1997 |
| JP | 2000-029132 | 1/2000 |
| JP | 2001-298640 | 10/2001 |
| JP | 2001-359287 | 12/2001 |
| JP | 2002-229110 | 8/2002 |

OTHER PUBLICATIONS

Machine translation of Japanese Published Application 07-151946.*
European Search Report for Application No. EP 04 01 9961.
European Search Report for Application No. EP 04 01 9962.
Japanese Office Action for Application No. 2002-181754, mailed Dec. 19, 2006 (2 pgs.) with translation (3 pgs.).

* cited by examiner

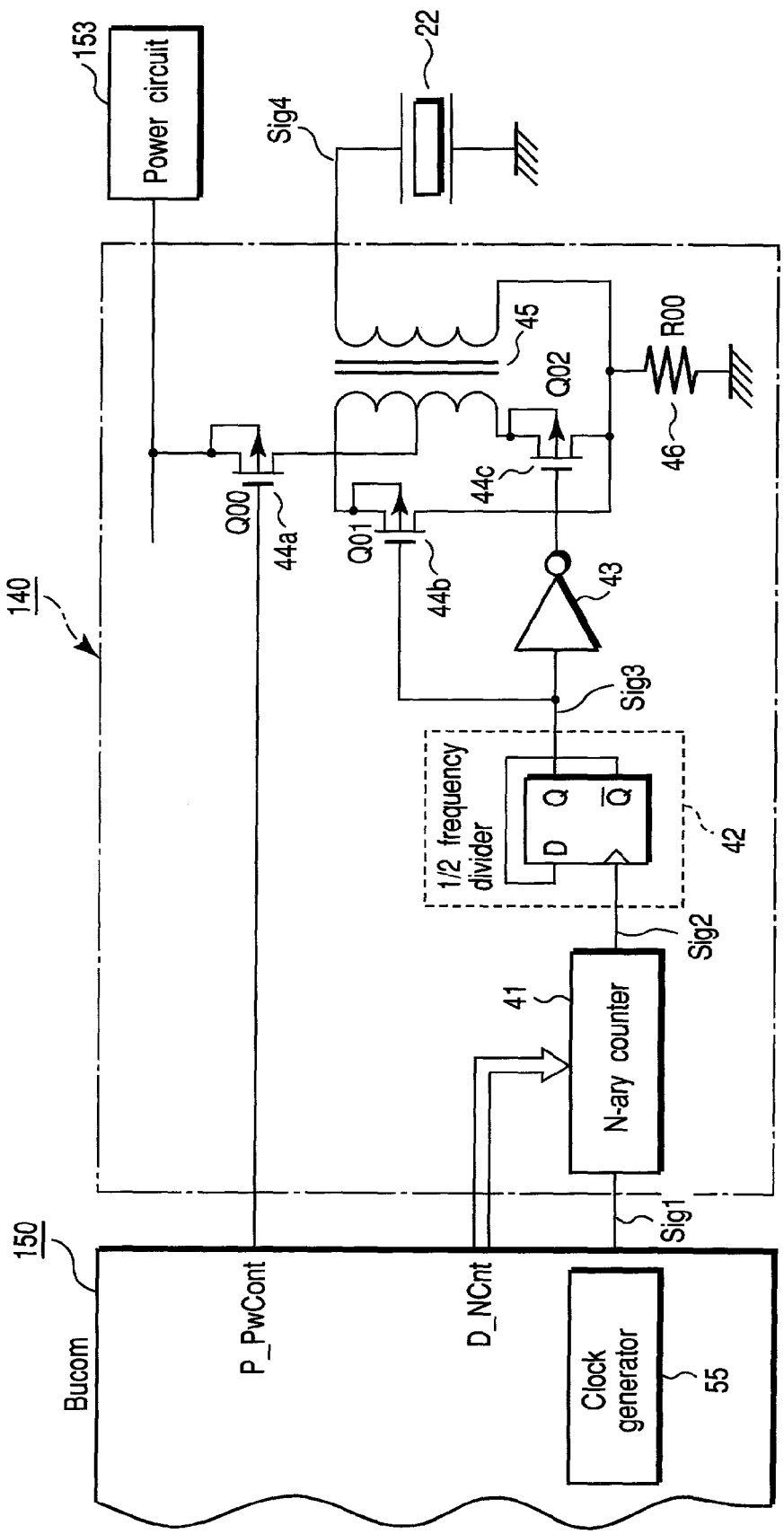
F I G. 9A

FIG. 10A
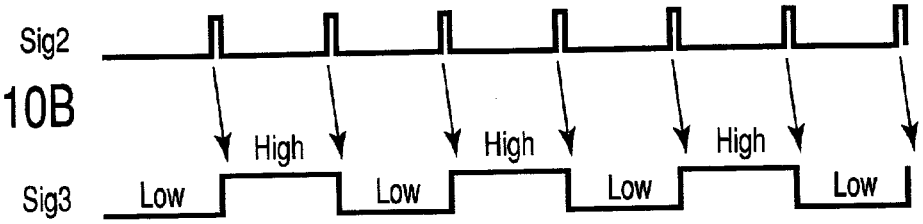
FIG. 10B
FIG. 10C
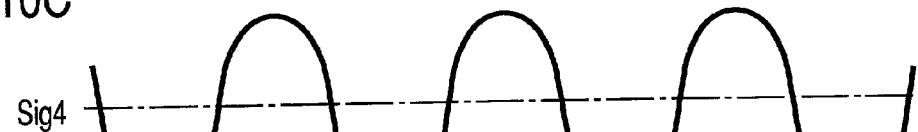
FIG. 10D
FIG. 10E
FIG. 10F

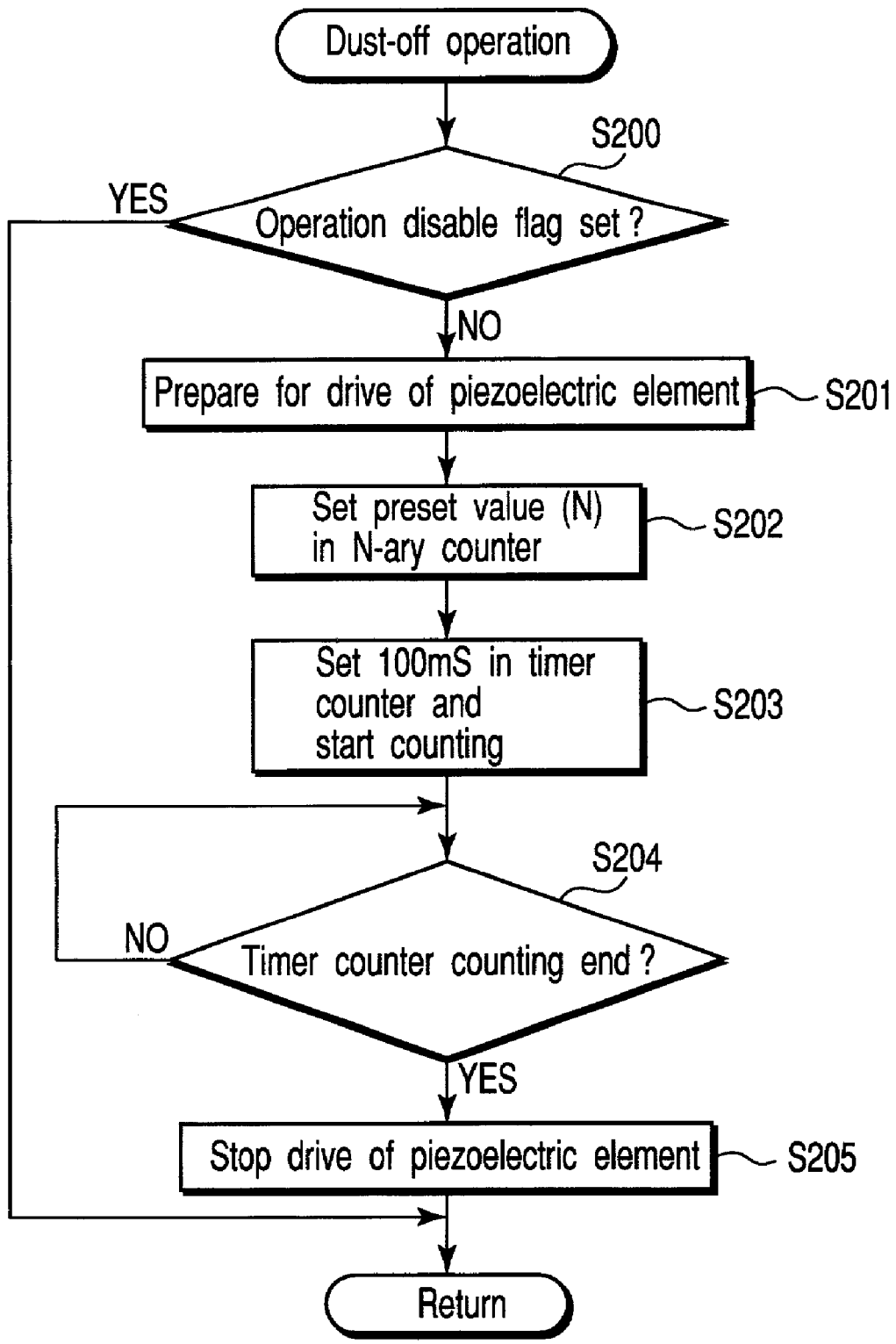
F I G. 12C

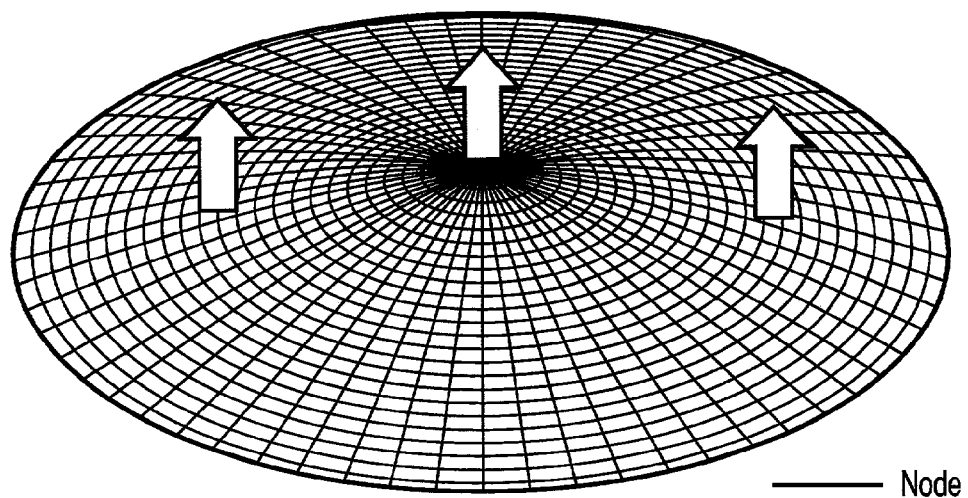
F I G. 14A
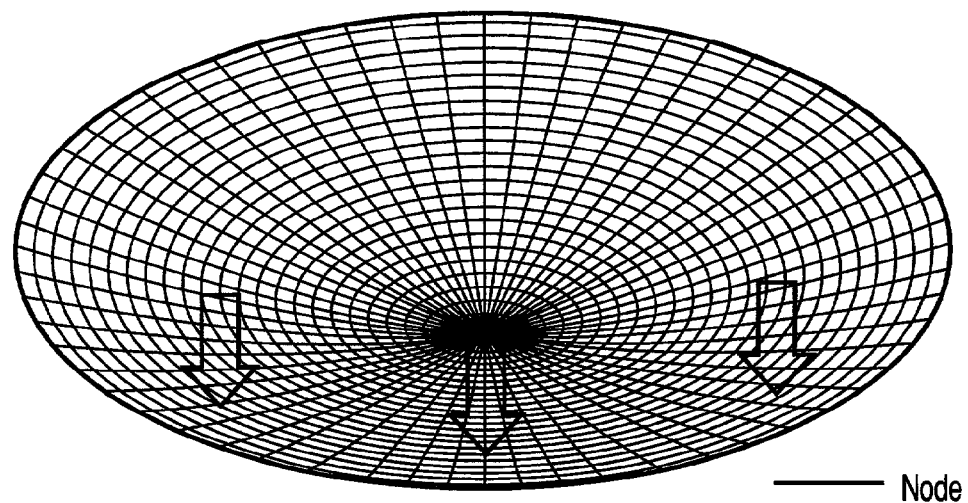
F I G. 14B

| | StartOffset | StopOffset | OscTime(msec) | |
|---|---|---|---|---|
| t<0°C | 1 | 7 | 100 | |
| 0°C≦t<15°C | 2 | 8 | 100 | |
| 15°C≦t<30°C | 3 | 9 | 100 | ←--*0 |
| 30°C≦t | 4 | 10 | 100 | |

| | StartOffset | StopOffset | OscTime(msec) |
|---|---|---|---|
| t<0°C | 3 | 11 | 70 |
| 0°C≦t<15°C | 4 | 12 | 70 |
| 15°C≦t<30°C | 5 | 13 | 70 |
| 30°C≦t | 6 | 14 | 70 |

|  | Preset value (N) | Driving frequency (KHz) |
|---|---|---|
| 0 | 493 | 40.57 |
| 1 | 494 | 40.49 |
| 2 | 495 | 40.40 |
| 3 | 496 | 40.32 |
| 4 | 497 | 40.24 |
| 5 | 498 | 40.16 |
| 6 | 499 | 40.08 |
| 7 | 500 | 40.00 |
| 8 | 501 | 39.92 |
| 9 | 502 | 39.84 |
| 10 | 503 | 39.76 |
| 11 | 504 | 39.68 |
| 12 | 505 | 39.60 |
| 13 | 506 | 39.53 |
| 14 | 507 | 39.45 |

*1 → row 3; *2 → row 9

→ f1, f2, f3, f4, f5, f6, f7

F I G. 18A

|  | Preset value (N) | Driving frequency (KHz) |
|---|---|---|
| 0 | 993 | 20.14 |
| 1 | 994 | 20.12 |
| 2 | 995 | 20.10 |
| 3 | 996 | 20.08 |
| 4 | 997 | 20.06 |
| 5 | 998 | 20.04 |
| 6 | 999 | 20.02 |
| 7 | 1000 | 20.00 |
| 8 | 1001 | 19.98 |
| 9 | 1002 | 19.96 |
| 10 | 1003 | 19.94 |
| 11 | 1004 | 19.92 |
| 12 | 1005 | 19.90 |
| 13 | 1006 | 19.88 |
| 14 | 1007 | 19.86 |

F I G. 18B

| StartOffset | 3 |
|---|---|
| StopOffset | 9 |
| StepTime | 2(msec) |
| ADwait | 80($\mu$sec) |
| M10scTime | 200(msec) |

| StartOffset | 2 |
|---|---|
| StopOffset | 10 |
| StepTime | 1(msec) |
| ADwait | 40($\mu$sec) |
| M20scTime | 100(msec) |

| Preset value (N) | Driving frequency (KHz) |
|---|---|
| 493 | 40.57 |
| 494 | 40.49 |
| 495 | 40.40 |
| 496 | 40.32 |
| 497 | 40.24 |
| 498 | 40.16 |
| 499 | 40.08 |
| 500 | 40.00 |
| 501 | 39.92 |
| 502 | 39.84 |
| 503 | 39.76 |
| 504 | 39.68 |
| 505 | 39.60 |
| 506 | 39.53 |
| 507 | 39.45 |

F1 → 493
F2 → 507

OPTICAL APPARATUS HAVING DUST OFF FUNCTION

CROSS-REFERENCE TO RELATED APPLICATIONS

This application is based upon and claims the benefit of priority from the prior Japanese Patent Applications No. 2002-142701, filed May 17, 2002; No. 2002-142702, filed May 17, 2002; and No. 2002-181754, filed Jun. 21, 2002, the entire contents of which are incorporated herein by reference.

BACKGROUND OF THE INVENTION

1. Field of the Invention

The present invention relates to an optical apparatus having dust-off function, in which dust adhering to the inside of the optical apparatus can be removed, and more specifically, to an optical apparatus having a dust-off function for an image-pickup element such as an electronic image-pickup apparatus (digital camera or the like) and capable of also detecting an abnormal state of the dust-off function.

2. Description of Related Art

In an electronic image-pickup apparatus such as a digital camera, various mechanisms that mechanically operate are arranged in its apparatus body. Therefore, dust and the like that are generated from the mechanisms adhere to the photoelectric conversion surface of an image-pickup element, thereby inevitably degrading photographed images.

Accordingly, a technique is proposed as an example of a technique related to the dust-off function of an electronic image-pickup apparatus. According to this technique, dust or the like adhering to a protective glass plate (referred to as "dust-off glass" or "dust-off filter") for protecting the image-pickup element is shaken off by vibrating the protective glass plate. In a prior art system, therefore, a piezoelectric element is provided as means for vibrating the protective glass plate, for example. The protective glass plate that is attached to the piezoelectric element is vibrated with a given period by utilizing the behavior of the piezoelectric element to extend or contract in response to cyclic voltage applied thereto.

According to the prior art described above, however, the amplitude of vibration of the dust-off protective glass plate itself is scanty.

In order to shake off dust securely, in general, it is advisable to maximize the amplitude of vibration of the glass plate. In order to increase the amplitude of vibration of the glass plate, however, the glass plate must be vibrated with its own natural resonance frequency. Otherwise, the glass plate can only vibrate with the displacement of the piezoelectric element itself, so that the dust cannot be shaken off efficiently.

Normally, the resonance frequency varies depending on the shape, material, supporting method, and vibration mode (vibration form) of the glass plate. If glass plates are mass-produced as protective glasses, moreover, the resonance frequency also varies owing to dispersion of working accuracy. However, the dispersion can be canceled by measuring the resonance frequency of each individual protective glass and suitably adjusting the frequency of an oscillator that applies voltage to the piezoelectric element during operation.

However, the aforesaid canceling method cannot cope with the dispersion if the resonance frequency of the protective glass drifts owing to aging and temperature change. Thus, even if the resonance frequency of the oscillator is securely adjusted, the protective glass cannot always be driven with its resonance frequency.

Accordingly, there is a demand for a system in which dust can be removed easily and efficiently without adjusting variations in factors (shape of the glass plate, modulus of elasticity of the material, etc.) that influence the resonance frequency of the glass plate for use as a protective glass during manufacturing processes for the protective glass or camera operation.

If a part of a dust-off mechanism goes wrong so that satisfactory vibration fails to be generated during operation, moreover, it may be anticipated that the situation will not be able to be recognized with the naked eye. Further, a measuring device such as a laser displacement gage is needed to determine whether or not the dust-off mechanism is abnormal.

However, general users cannot detect anything abnormal about the dust-off mechanism by means of the measuring device. The fact is that if a satisfactory dust-off effect cannot be obtained due to anything abnormal, the abnormality cannot be recognized.

The present invention has been contrived in consideration of these circumstances, and its first object is to provide an optical apparatus having dust-off function that includes a system such that a dust-off glass whose resonance frequency cannot be specified in one position can be driven efficiently, in an optical apparatus that has a dust-off function for shaking off dust or the like adhering to the dust-off glass on the front face of an image-pickup element, for example, by vibrating the dust-off glass. A second object is to provide an optical apparatus having dust-off function in which trouble in its dust-off function can be detected with ease.

BRIEF SUMMARY OF THE INVENTION

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

A first mode of the present invention has the following features. More specifically, there is provided an optical apparatus having dust-off function, comprising a photoelectric conversion element (image-pickup means) configured to convert an optical image of a subject into electric information, an image-pickup optical system configured to focus the optical image of the subject on a light receiving surface of the photoelectric conversion element, and a dust-off glass (optical element) located between the light receiving surface of the photoelectric conversion element and the image-pickup optical system, and further comprising a vibrating mechanism configured to vibrate the dust-off glass, the vibrating mechanism controlling vibrating operation so that the frequency of vibration waves generated in the dust-off glass changes with the passage of time.

Further, a second mode has the following features. More specifically, there is provided an optical apparatus having dust-off function, further comprising first vibrating means for vibrating an optical element with a plurality of frequencies in succession, detecting means for monitoring a state of vibration of the optical element during vibrating operation of the first vibrating means, thereby detecting the resonance frequency of the optical element, and second vibrating means for vibrating the optical element with the resonance frequency detected by means of the detecting means or a frequency approximate to the resonance frequency.

Alternatively, a third mode has the following features. More specifically, there is provided an optical apparatus having dust-off function, further comprising vibrating means for vibrating the dust-off glass, monitoring means for monitoring the state of vibration of the dust-off glass, and abnormality detecting means for detecting an abnormal state of the dust-off glass or the vibrating means in accordance with an output signal from the monitoring means.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9A is a circuit diagram of a dust-off glass drive circuit of the camera having dust-off function according to the first embodiment;

FIGS. 10A to 10F are time charts showing operation and control for the drive of the dust-off glass of the camera having dust-off function according to first, second, or third embodiment;

FIG. 12C is a flowchart illustrating in detail steps of procedure of a subroutine "dust-off operation" according to the third embodiment;

FIGS. 14A and 14B are diagrams showing states of vibration of a glass plate according to the present invention and illustrating a form (vibration mode 1) in which nodes are generated around the glass plate so that the whole surface vibrates in the same phase;

FIG. 16 is a memory map showing table regions in an EEPROM according to the first embodiment related to temperature correction or frequency correction;

FIGS. 17A and 17B show control parameters related to temperature and vibration mode frequency correction according to the first embodiment, in which FIG. 17A is a list showing the details of a temperature correction table for vibration mode 1, and FIG. 17B is a list showing the details of a temperature correction table for vibration mode 2;

FIGS. 18A and 18B show correction values corresponding to the vibration modes according to the first embodiment, in which FIG. 18A is a detailed version of a frequency correction table for vibration mode 1, and FIG. 18B is a detailed version of a frequency correction table for vibration mode 2;

FIG. 19 is a characteristic graph representing the relation between the driving frequency and the amplitude of the glass plate according to the first and second embodiments;

FIGS. 20A and 20B show control parameters related to vibration mode frequency correction according to the second embodiment, in which FIG. 20A is a list showing the details of a control parameter table for vibration mode 1, and FIG. 20B is a list showing the details of a control parameter table for vibration mode 2;

DETAILED DESCRIPTION OF THE INVENTION

Three embodiments for cases where the present invention is applied to a digital camera will now be described with reference to the accompanying drawings. Prior to a detailed description of particulars of the individual embodiments, an external appearance and fundamental structure of the digital camera that is common to the embodiments will be reviewed.

Figure 1:
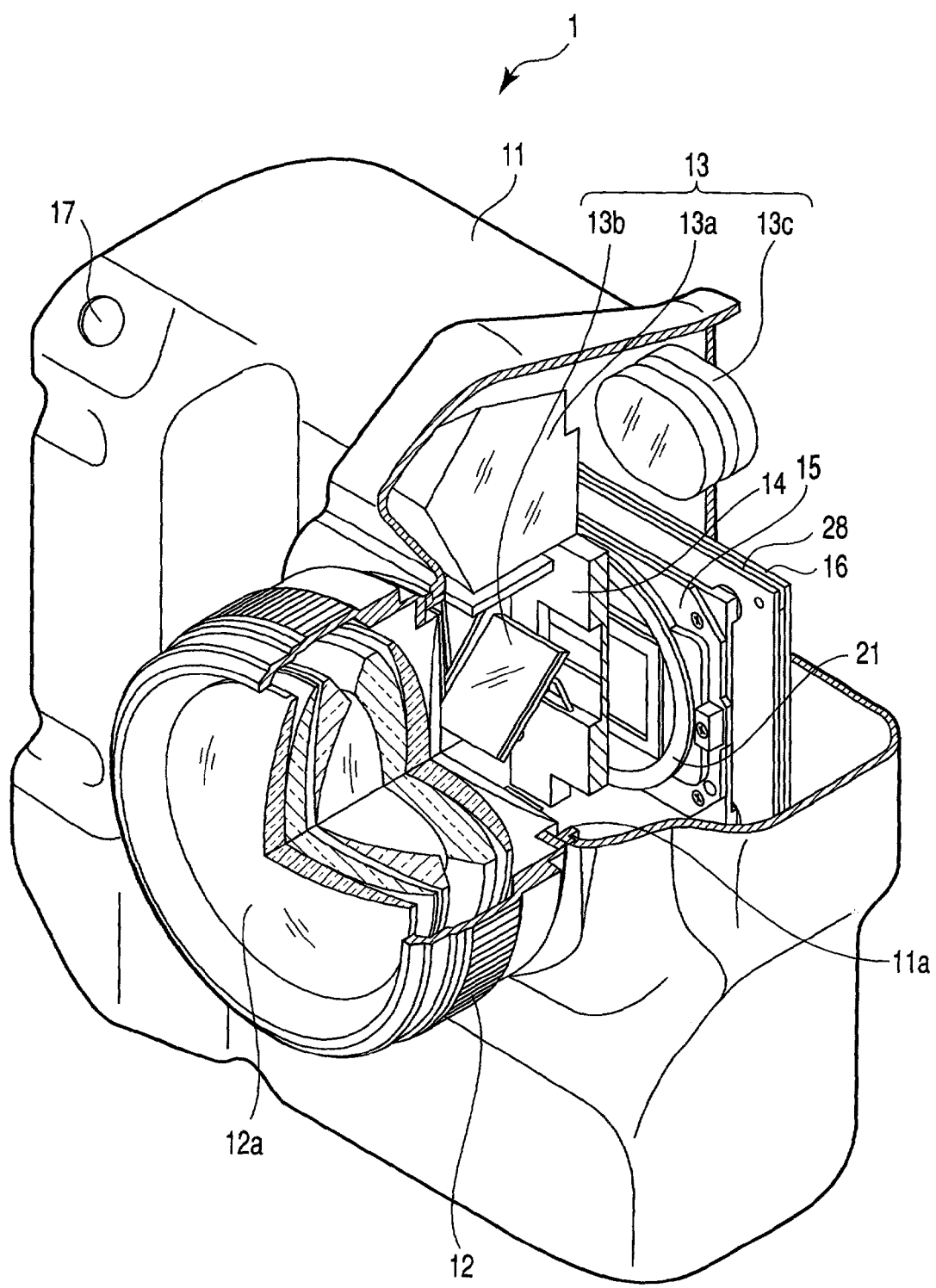
FIG. 1 is a cutaway perspective view showing an external appearance of a camera according to first, second, and third embodiments of the present invention and illustrating the internal configuration of the camera.

FIG. 1 shows an external appearance of the digital camera and schematically illustrates the internal configuration of the camera in a cutaway view.

A camera 1 is composed of a camera body 11 and a lens barrel 12 such that a lens unit and a body unit are formed separately. These two elements are removable from each other. The lens barrel 12 is formed holding therein a photographing optical system 12a that is composed of a plurality of lenses, a drive mechanism therefor, etc. The photographing optical system 12a is composed of, for example, a plurality of optical lenses and the like through which a luminous flux from a subject is transmitted to form an image of the subject, formed of the subject luminous flux, in a given position (on the photoelectric conversion surface of an image-pickup element mentioned later).

The lens barrel 12 is attached to the front face of the camera body 11 so as to project from it. Further, the camera body 11 is a "single-lens reflex" camera, which is provided with various component members therein and has, on its front face, a photographing optical system mounting portion 11a as a connecting member on which the lens barrel 12 for holding the photographing optical system 12a is removably mounted.

More specifically, an exposure opening having a given bore such that the subject luminous flux can be guided into the camera body 11 is formed substantially in the central portion of the camera body 11, and the photographing optical system mounting portion 11a is formed on the peripheral edge portion of the exposure opening.

Further, the photographing optical system mounting portion 11a is located on the outside the camera body 11, e.g., on its front face, and besides, various control members for operating the camera body 11, such as a release button 17 for use as an indication control member for starting photographing operation, are arranged in given positions on the upper surface, back surface, etc.

On the other hand, the camera body 11 has therein various component members, such as a finder device 13, a shutter portion 14, an image-pickup unit 15, a plurality of circuit boards (only a main circuit board 16 is shown in this case), etc., which are arm in given positions, individually. The finder device 13 constitutes an "observational optical system." The shutter portion 14 is provided with a shutter mechanism for controlling the time of irradiation of the photoelectric conversion surface of the image-pickup element with the subject luminous flux and the like. The image-pickup unit 15 includes the image-pickup element (not shown) for obtaining an image signal corresponding to the subject image, a dust-off glass (dust-off filter) 21 as a dust-off member, etc. The dust-off glass is located in a given position on the front side of the photoelectric conversion surface of the image-pickup element, and serves to prevent dust or the like from adhering to the photoelectric conversion surface. The circuit boards typically include the main circuit board 16 on which various electric members that constitute an electric circuit are mounted.

The finder device 13 is composed of a reflector (referred to also as "quick-return mirror") 13b that is configured to be able to bend the optical axis of the subject luminous flux transmitted through the photographing optical system 12a and guide it to the side of the observational optical system, a pentaprism 13a that receives the luminous flux emitted from the reflector 13b and forms an erect image, an eyepiece 13c that enlarges the image formed by means of the pentaprism 13a and forms an optimum image for observation, etc.

The reflector 13b is movable between a position in which it is off the optical axis of the photographing optical system 12a and a predetermined position on the optical axis. In a normal state, it is located on the optical axis of the photographing optical system 12a at a given angle, e.g., 45°, to the optical axis.

When the camera 1 is in the normal state (state for subject observation), with this configuration, the subject luminous flux transmitted through the photographing optical system 12a has its optical axis bent by means of the reflector 13b, and is reflected toward the pentaprism 13a that is located over the reflector 13b.

While the camera 1 is executing the photographing operation, on the other hand, the reflector 13b moves to the predetermined position off the optical axis of the photographing optical system 12a. As the reflector 13b is evacuated in this manner, the subject luminous flux is guided to the image-pickup element side. Further, the applicable shutter portion 14 is of the same type that is generally used in a conventional camera or the like, including a shutter mechanism of the "focal-plane type" and its drive circuit, for example.

Figure 2:
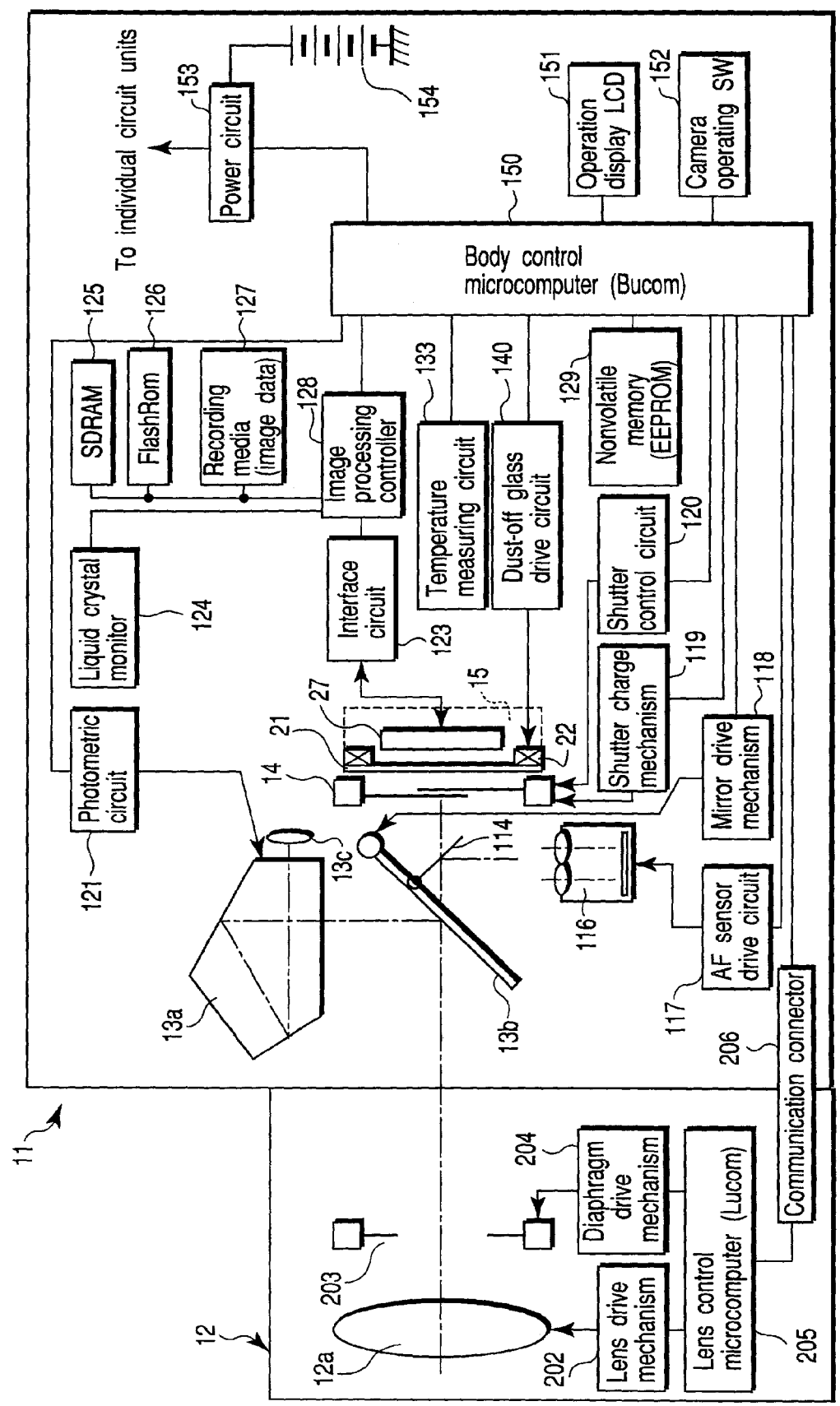
FIG. 2 is a block diagram schematically showing the system configuration of the camera according to each embodiment.

FIG. 2 is a block diagram showing a system configuration of a digital camera of each of the embodiments according to the present invention. This camera system is composed mainly of the camera body 11 and the lens barrel (referred to also as "lens unit") 12 for use a spare lens. The desired lens barrel 12 can be attached to and detached from the front of the camera body 11.

The lens barrel 12 is controlled by means of a lens control microcomputer (hereinafter referred to as "Lucom") 205. On the other hand, the camera body 11 is controlled by means of a microcomputer (hereinafter referred to as "Bucom") 150.

The Lucom 205 and the Bucom 150 are connected electrically to each other for communication by means of a communication connector 206 when they are joined together. The camera system is set so that the Lucom 205 subordinately cooperates with the Bucom 150.

The photographing optical system 12a and a stop 203 are provided in the lens barrel 12. The photographing optical system 12a is driven by means of a DC motor (not shown) that is located in a lens drive mechanism 202. The stop 203 is driven by means of a stepping motor (not shown) that is located in a stop drive mechanism 204. The Lucom 205 controls these individual motors in accordance with commands from the Bucom 150.

The following component members are arranged in the camera body 11, as shown in FIG. 2. Arranged as optical systems, for example, are single-lens reflex component members (pentaprism 13a, reflector 13b, eyepiece 13c, and sub-mirror 114), a shutter 115 of the focal-plane type, and an AF sensor unit 116 that receives a reflected luminous flux from the sub-mirror 114 and uses it for automatic range-finding.

Also arranged are an AF sensor drive circuit 117 for drivingly controlling the AF sensor unit 116, a mirror drive mechanism 118 for drivingly controlling the reflector 13b, a shutter charge mechanism 119 for charging spring force for driving the front and rear blinds of the shutter 115, a shutter control circuit 120 for controlling the movement of the front and rear blinds, and a photometric circuit 121 for photometric processing based on the luminous flux from the pentaprism 13a.

An image-pickup element 27 for photoelectrically converting the subject image transmitted through the optical systems is provided as a photoelectric conversion element on the optical axis. The image-pickup element 27 is protected by means of the dust-off glass 21 that is formed of a transparent glass member for use as an optical element and arranged between the photographing optical system 12a and the image-pickup element 27. As a part of vibrating means for vibrating the dust-off glass 21 at a given frequency, a piezoelectric element 22 is attached to the peripheral edge portion of the dust-off glass 21, for example.

The piezoelectric element 22 has two electrodes. A dust-off mechanism is constructed so that the piezoelectric element 22 can cause a dust-off glass drive circuit 140 as a part of the vibrating means to vibrate the dust-off glass 21, thereby removing dust adhering to the glass surface.

A temperature measuring circuit 133 is located near the dust-off glass 21 in order to measure the temperature around the image-pickup element 27.

This camera system is further furnished with an interface circuit 123 connected to the image-pickup element 27, a liquid crystal monitor 124, an SDRAM 125 provided as a storage region, and an image processing controller 128 for image processing utilizing a FlashROM 126, recording media 127, etc., and can provide an electronic recording/display function as well as an electronic photographing function.

For another storage region, a nonvolatile memory 129 formed of, for example, an EEPROM is provided as nonvolatile storage means for storing necessary given control parameters for camera control so as to be accessible through the Bucom 150.

The Bucom 150 is further provided with an operation display LCD 151 for notifying a user of the operating state of the camera 1 with a display output and a camera operating switch (SW) 152. The camera operating SW 152 is a switch group including necessary operating buttons for the operation of the camera 1, such as a release SW, mode change SW, power SW, etc.

Further provided are a battery 154 for use as a power source and a power circuit 153, which converts the voltage of the power source into a voltage required by individual circuit units that constitute the camera system and supply the resulting voltage.

The following is a description of the camera system constructed in this manner. Several parts of the camera system operate in the following manner.

First, the image processing controller 128 controls the interface circuit 123 in accordance with a command from the Bucom 150 and fetches image data from the image-pickup element 27.

The image data is converted into a video signal by means of the image processing controller 128 and displayed as an output on the liquid crystal monitor 124. Thus, the user as a photographer can recognize a photographed picture image from the image displayed on the liquid crystal monitor 124.

The SDRAM 125 is a memory for temporarily storage of the image data, and is used for a work area for the conversion of the image data. Further, the image data is set so that it can be stored in the recording media 127 after it is converted into JPEG data.

The image-pickup element 27 is protected by means of the dust-off glass 21 that is formed of a transparent glass member, as mentioned before. The piezoelectric element 22, as described in detail later, is driven by means of the dust-off glass drive circuit 140 that serves also as drive means for the piezoelectric element 22.

Preferably, for a dust-off effect, the image-pickup element 27 and the piezoelectric element 22 should be integrally held in a case that has the dust-off glass 21 as its one side and is surrounded by a frame such as the one indicated by broken line in FIG. 2.

Normally, temperature is one of factors that influence the modulus of elasticity of a glass member and change its undamped natural frequency. In operation, therefore, the temperature must be measured, and the change of the undamped natural frequency must be taken into consideration. Thus, it is advisable to measure the change of temperature of the dust-off glass 21, which serves to protect the front face of the image-pickup element 27 of which the temperature drastically rises during operation, and estimate the then undamped natural frequency.

In this case, therefore, a temperature sensor (not shown) that is connected to the aforesaid temperature measuring circuit 133 is provided for the measurement of the ambient temperature of the image-pickup element 27. Preferably, the temperature measurement point for the sensor should be set very close to the vibrating surface of the dust-off glass 21.

The mirror drive mechanism 118 is a quick-return mechanism for driving the reflector 13b between an UP position and a DOWN position. When the reflector 13b is in the DOWN position, a luminous flux from the photographing optical system 12a is guided split to the side of the AF sensor unit 116 and the side of the pentaprism 13a.

An output from an AF sensor in the AF sensor unit 116 is transmitted through the AF sensor drive circuit 117 to the Bucom 150 to be used for well-known range-finding.

Further, the user can visually observe the subject through the eyepiece 13c that adjoins the pentaprism 13a, while a part of the luminous flux transmitted through the pentaprism 13a is guided to a photosensor (not shown) in the photometric circuit 121, whereupon well-known photometric processing is executed.

Figure 3:
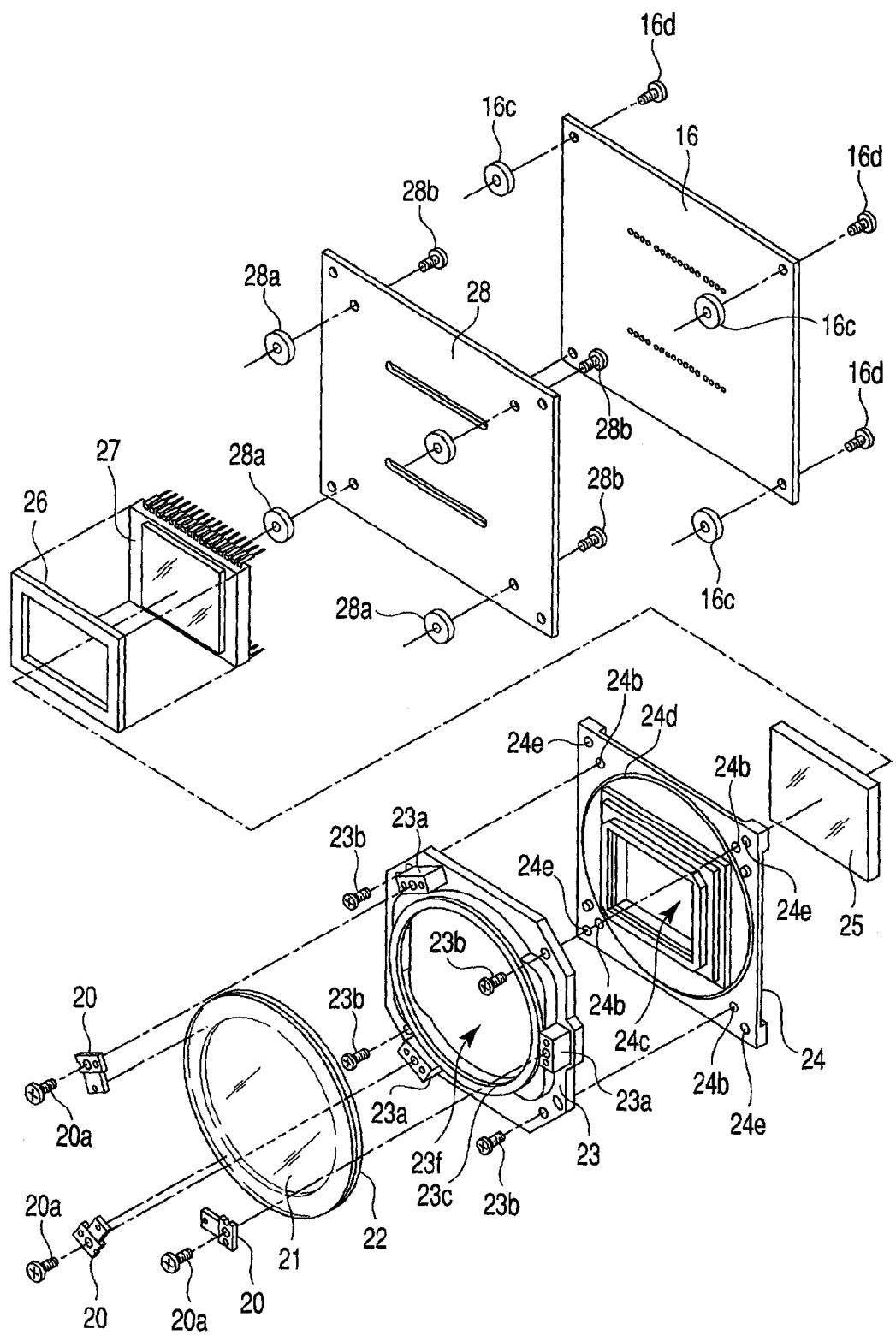
FIG. 3 is an exploded perspective view showing a part of an image-pickup unit of the camera according to each embodiment and illustrating the configuration of its principal part.
Figure 4:
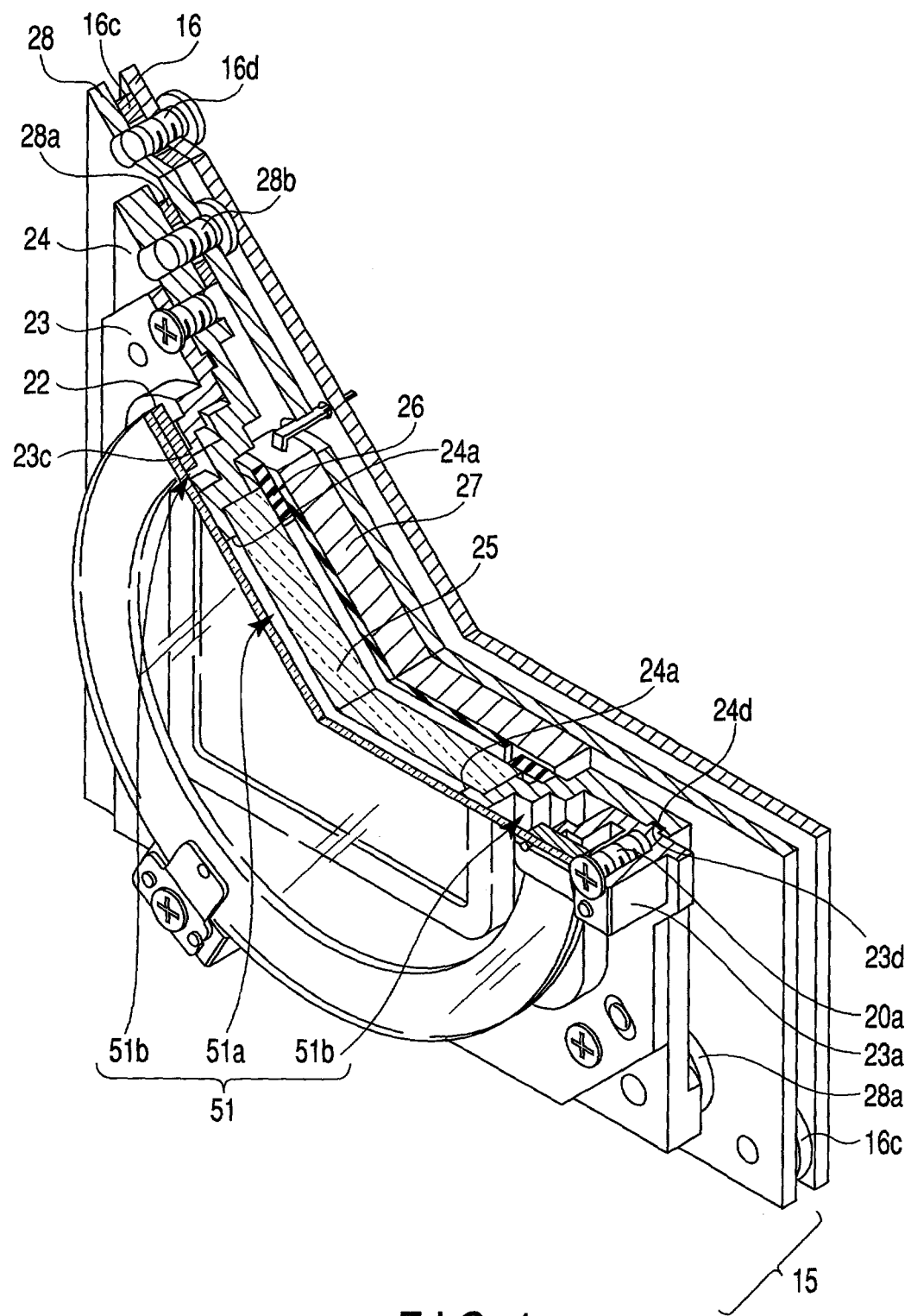
FIG. 4 is a cutaway perspective view of the image-pickup unit of the camera according to each embodiment in an assembled state.
Figure 5:
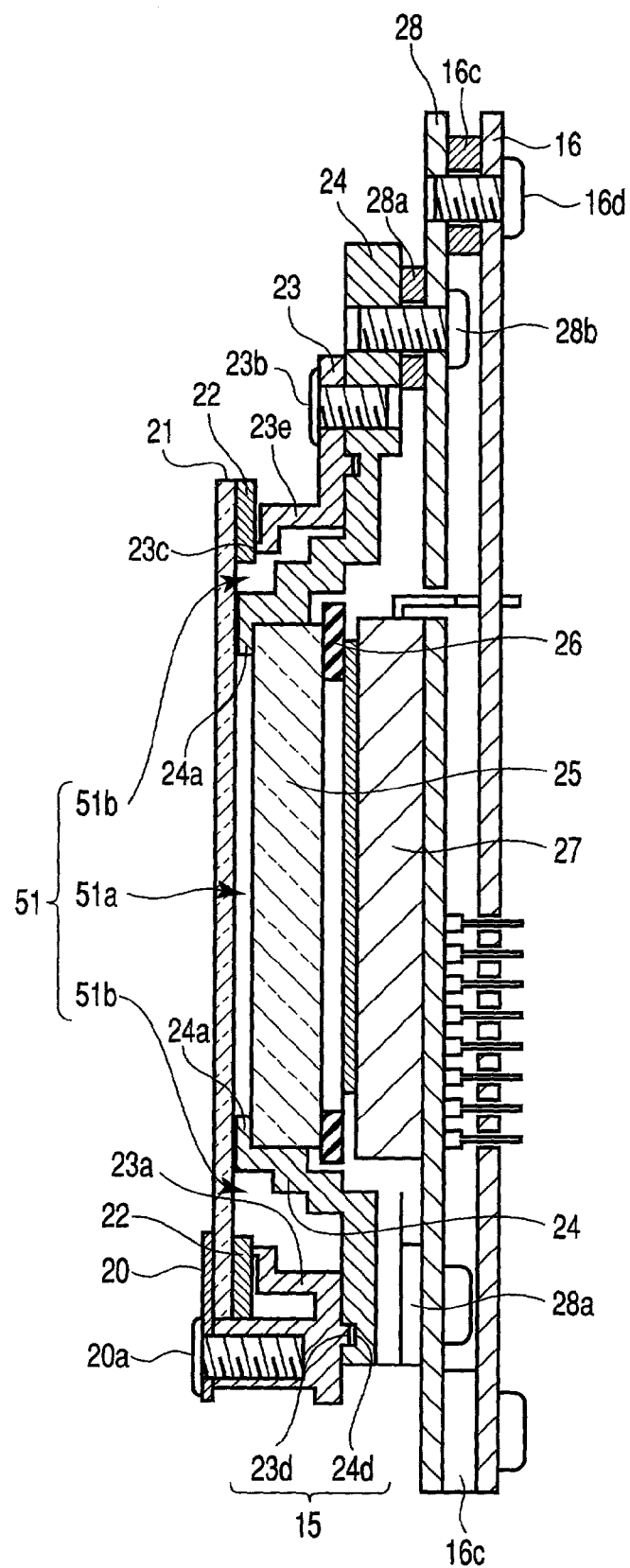
FIG. 5 is a sectional view showing the image-pickup unit of the camera according to each embodiment.

The following is a detailed description of the image-pickup unit 15 in the camera 1 of each of the embodiments according to the present invention. FIGS. 3, 4 and 5 individually show in detail extracted principal parts of the image-pickup unit 15 in the camera 1.

FIG. 3 is an exploded perspective view showing the image-pickup unit 15 in an exploded manner. FIG. 4 is a cutaway perspective view showing an assembled state of the image-pickup unit 15. FIG. 5 is a sectional view of the image-pickup unit 15. As mentioned before, the image-pickup unit 15 of the camera 1 is a unit that is composed of a plurality of members including the shutter portion 14. However, FIGS. 3 to 5 only show its principal parts, and illustration of the shutter portion 14 is omitted.

In order to indicate the relative positions of the individual component members, moreover, FIGS. 3 to 5 also show the main circuit board 16, which is located near the image-pickup unit 15, mounted with the image-pickup element 27, and mounted with an image signal processing circuit and an electronic circuit of a photographing system that is formed of working memories. A detailed description of the main circuit board 16 itself is omitted on the supposition that it is one that is generally utilized in a conventional camera or the like.

The image-pickup unit 15 is composed of the following various members. More specifically, it comprises the image-pickup element 27, an image-pickup element fixing plate 28, and an optical low-pass filter (hereinafter referred to as "optical LPF") 25. The image-pickup element 27 is formed of a CCD or the like and can obtain an image signal corresponding to light transmitted through the photographing optical system 12a and applied to its photoelectric conversion surface. The image-pickup element fixing plate 28 is formed of a sheetlike member that fixedly supports the image-pickup element 27. The optical LPF 25 is an optical element that is located on the side of the photoelectric conversion surface of the image-pickup element 27 and formed so as to be able to remove high-frequency components from the subject luminous flux transmitted through the photographing optical system 12a and applied thereto. Further, the image-pickup unit 15 comprises a low-pass filter receiving member 26, an image-pickup element storage case member 24 (hereinafter referred to as "CCD case 24"), a dust-off glass receiving member 23, the dust-off glass 21, pressure members 20, etc. The low-pass filter receiving member 26 is formed of an elastic member or the like substantially in the form of a frame that is located in a peripheral edge portion between the optical LPF 25 and the image-pickup element 27. The CCD case 24 stores and fixedly holds the image-pickup element 27, supports the optical LPF 25 (optical element) so as to be intimately in contact with its peripheral edge region and its vicinities, and is located so that its predetermined region is intimately in contact with the dust-off glass receiving member 23, which will be described below. The dust-off glass receiving member 23 is located on the front side of the CCD case 24 and supports the dust-off glass 21 so as to be intimately in contact with its peripheral edge region and its vicinities. The dust-off glass 21 is a dust-off member that is opposed to a predetermined position at a given distance from the optical LPF 25, on the side of the photoelectric conversion surface of the image-pickup element 27 and on the front side of the optical LPF 25. The piezoelectric element 22 is a vibrating member that is located in the peripheral edge portion of the dust-off glass 21 and serves to apply a predetermined vibration to the dust-off glass 21, and is formed of an electromechanical transducer element or the like, for example. The pressure members 20 are each formed of an elastic body for airtightly bonding the dust-off glass 21 to the dust-off glass receiving member 23 and holding it fixedly.

The image-pickup element 27 receives the subject luminous flux transmitted through the photographing optical system 12a on its photoelectric conversion surface and carries out photoelectric conversion, thereby acquiring an image signal corresponding to the subject image formed on the photoelectric conversion surface, and is formed of a charge coupled device (CCD), for example.

The image-pickup element 27 is mounted in a predetermined position on the main circuit board 16 by means of the image-pickup element fixing plate 28. The image signal processing circuit, working memories, etc. are mounted together on the main circuit board 16, as mentioned before, and output signals delivered from the image-pickup element 27 are processed in these circuits. The optical LPF 25 is located on the front side of the image-pickup element 27 with the low-pass filter receiving member 26 between them.

The CCD case 24 is located so as to cover the image-pickup element 27, low-pass filter receiving member 26, and optical LPF 25.

Thus, the CCD case 24 is provided with a rectangular opening 24c in its substantially central portion. The optical LPF 25 and the image-pickup element 27 can be fitted into the opening 24c from behind. As shown in FIGS. 4 and 5, a step portion 24a having a substantially L-shaped profile is formed on the inner peripheral edge portion behind the opening 24c.

As mentioned before, the low-pass filter receiving member 26 formed of an elastic member or the like is located between the optical LPF 25 and the image-pickup element 27. The low-pass filter receiving member 26 is located in a position off the effective range of the photoelectric conversion surface in the front-side peripheral edge portion of the image-pickup element 27, and can engage a portion near the rear-side peripheral edge portion of the optical LPF 25. Airtightness can be substantially secured between the optical LPF 25 and the image-pickup element 27. Thus, an elastic force of the low-pass filter receiving member 26 in the direction of the optical axis acts on the optical LPF 25.

Accordingly, the front-side peripheral edge portion of the optical LPF 25 is located substantially airtightly in contact with the step portion 24a of the CCD case 24, whereby the position of the optical LPF 25 in the optical-axis direction can be regulated against the elastic force of the low-pass filter receiving member 26 that urges the optical LPF 25 to shift its position in the optical-axis direction. In other words, the optical LPF 25 that is inserted into the opening 24c of the CCD case 24 from behind. Thus, the optical LPF 25 is prevented from slipping out forward from the CCD case 24.

After the optical LPF 25 is inserted into the opening 24c of the CCD case 24 from behind in this manner, the image-pickup element 27 is located on the rear side of the optical LPF 25.

In this case, the low-pass filter receiving member 26 is held between the optical LPF 25 and the image-pickup element 27 in the peripheral edge portion. As mentioned before, moreover, the image-pickup element 27 is mounted on the main circuit board 16 with the image-pickup element fixing plate 28 between them. The image-pickup element fixing plate 28 is fixed to tapped holes 24e from behind the CCD case 24 with spacers 28a between them by means of screws 28b.

Further, the main circuit board 16 is fixed to the image-pickup element fixing plate 28 with spacers 16c between them by means of screws 16d.

On the front side of the CCD case 24, the dust-off glass receiving member 23 is fixed to tapped holes 24b of the CCD case 24 by means of screws 23b. As shown in detail FIGS. 4 and 5, in this case, a circumferential groove 24d is formed substantially in the form of a ring in a predetermined position on the front side of the CCD case 24 on its peripheral edge side.

On the other hand, a ring-shaped ridge 23d (not shown FIG. 3) that corresponds to the circumferential groove 24d of the CCD case 24 is formed substantially in the form of a ring covering the whole circumference in a predetermined position on the rear side of the dust-off glass receiving member 23 on its peripheral edge side. As the ring-shaped ridge 23d is fitted in the circumferential groove 24d, therefore, the CCD case 24 and the dust-off glass receiving member 23 are mated substantially airtightly with each other in an annular region, that is, the region in which the circumferential groove 24d and the ring-shaped ridge 23d are formed.

The dust-off glass 21 is in the form of a circular or polygonal plate as a whole, and its region that has a given extent in the radial direction from its center constitutes a transparent portion. This transparent portion is opposed to the front side of the optical LPF 25 at a given space from it. Further, the piezoelectric element 22, which is a specific vibrating member for applying vibration to the dust-off glass 21 and is formed of an electromechanical transducer element or the like, is located integrally on the peripheral edge portion of one surface (e.g., rear side) of the dust-off glass 21 by pasting with, for example, an adhesive or other means.

The piezoelectric element 22 is configured to be able to generate a given vibration in the dust-off glass 21 as it is externally supplied with a given driving voltage. The dust-off glass 21 is fixedly held by means of the pressure members 20 that are each formed of an elastic body such as a leaf spring so that they can be airtightly bonded to the dust-off glass receiving member 23.

A circular or polygonal opening 23f is provided near the substantially central portion of the dust-off glass receiving member 23. The opening 23f is adjusted to a size large enough to permit the passage of the subject luminous flux transmitted through the photographing optical system 12a and to allow the luminous flux to be applied to the photoelectric conversion surface of the image-pickup element 27 that is located behind it. Further, a wall portion 23e (see FIGS. 4 and 5) that project on the front side is formed substantially in the form of a ring on the peripheral edge portion of the opening 23f, and a receiving portion 23c is formed on the distal end side of the wall portion 23e so as to project further on the front side.

On the other hand, a plurality of projections 23a (e.g., three in number) are formed near the outer peripheral edge portion on the front side of the dust-off glass receiving member 23 so as to project on the front side. The projections 23a are regions that are formed in order to fix the pressure members 20 for fixedly holding the dust-off glass 21. The pressure members 20 are fixed individually to the respective distal end portions of the projections 23a with use of fastening means such as screws 20a.

The pressure members 20 are members that are formed of an elastic body such as a leaf spring each, as mentioned before. Their respective proximal end portions are fixed to the projections 23a, and their free end portions abut against the outer peripheral edge portion of the dust-off glass 21. Thus, the dust-off glass 21 is pressed toward the dust-off glass receiving member 23, that is, in the optical-axis direction.

As a specific region of the piezoelectric element 22 on the outer peripheral edge portion on the rear side of the dust-off glass 21 engages the receiving portion 23c, in this case, the respective positions of the dust-off glass 21 and the piezoelectric element 22 in the optical-axis direction are regulated. Thus, the dust-off glass 21 is fixedly held so as to be airtightly bonded to the dust-off glass receiving member 23 with the piezoelectric element 22 between them. In other words, the dust-off glass receiving member 23 is configured to be airtightly bonded to the dust-off glass 21 with the piezoelectric element 22 between them by means of the urging force of the pressure members 20.

As described above, the dust-off glass receiving member 23 and the CCD case 24 are designed so that the circumferential groove 24d and the ring-shaped ridge 23d (see FIGS. 4 and 5) are mated substantially airtightly with each other. At the same time, the dust-off glass receiving member 23 and the dust-off glass 21 are airtightly bonded to each other with the piezoelectric element 22 between them by means of the urging force of the pressure members 20.

The optical LPF 25 in the CCD case 24 is located so that airtightness can be substantially secured between the front-side peripheral edge portion of the optical LPF 25 and the step portion 24a of the CCD case 24. Further, the image-pickup element 27 is located on the rear side of the optical LPF 25 with the low-pass filter receiving member 26 between them. Airtightness is also substantially secured between the optical LPF 25 and the image-pickup element 27. Thus, a specific gap portion 51a is defined in a space between the optical LPF 25 and the dust-off glass 21 that are opposed to each other.

Further, the peripheral edge side of the optical LPF 25 or the CCD case 24, the dust-off glass receiving member 23, and the dust-off glass 21 define a space portion 51b. The space portion 51b is a sealed space that is defined projecting outside the optical LPF 25 (see FIGS. 4 and 5).

The space portion 51b is a space wider than the gap portion 51a. A space that is formed of the gap portion 51a and the space portion 51b constitutes a sealed space 51 that is sealed substantially hermetically by means of the CCD case 24, dust-off glass receiving member 23, dust-off glass 21, and optical LPF 25, as mentioned before.

Thus, in the image-pickup unit 15 of the camera 1, a sealed structure portion is formed defining the substantially hermetically sealed space 51 that includes the gap portion 51a defined around the optical LPF 25 and the dust-off glass 21. This sealed structure portion is located ranging from the peripheral edge of the optical LPF 25 or its vicinities to an outside position.

Further, the sealed structure portion is composed of the dust-off glass receiving member 23 as a first member that supports the dust-off glass 21 so as to be intimately in contact with its peripheral edge region and its vicinities, the CCD case 24 as a second member that supports the optical LPF 25 so as to be intimately in contact with its peripheral edge region and its vicinities and is located so that its predetermined region is intimately in contact with the dust-off glass receiving member 23, etc.

In the camera 1 constructed in this manner, the dust-off glass 21 is opposed to a predetermined position on the front side of the image-pickup element 27, and the sealed space 51 defined between the photoelectric conversion surface of the image-pickup element 27 and the peripheral edge of the dust-off glass 21 is sealed, whereby dust or the like is prevented from adhering to the photoelectric conversion surface of the image-pickup element 27. In this case, dust or the like that adheres to the front-side exposed surface of the dust-off glass 21 can be removed by applying a cyclic voltage to the piezoelectric element 22 that is located integrally on the peripheral edge portion of the dust-off glass 21, thereby applying a predetermined vibration to the dust-off glass 21.

Figure 6:
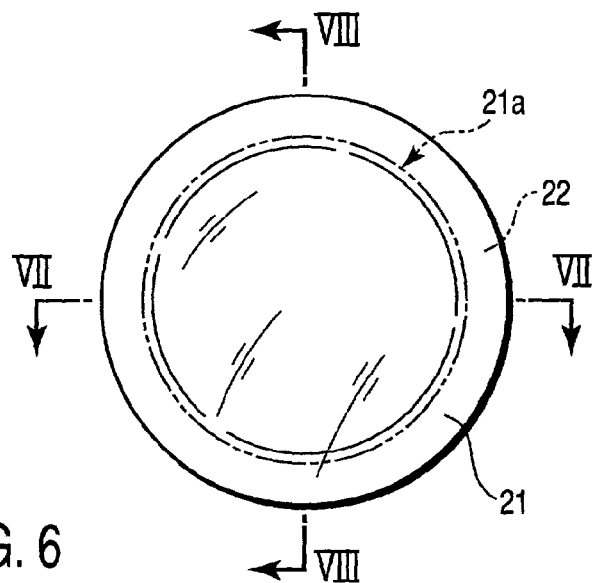
FIG. 6 is a front view showing only a dust-off glass and a piezoelectric element integral therewith, in the image-pickup unit of the camera according to each embodiment, in an extractive manner.

FIG. 6 is a front view showing only the dust-off glass 21 and the piezoelectric element 22 integral therewith, in the image-pickup unit 15 of the camera 1, in an extractive manner.

Figure 7:
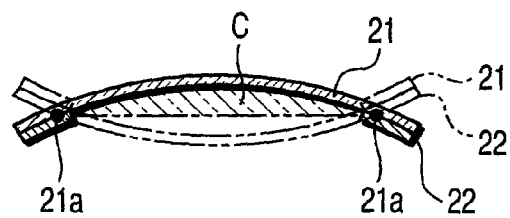
FIG. 7 is a sectional view taken along line VII—VII of FIG. 6, showing change of the state of the dust-off glass and the piezoelectric element caused when driving voltage is applied to the piezoelectric element of FIG. 6.
Figure 8:
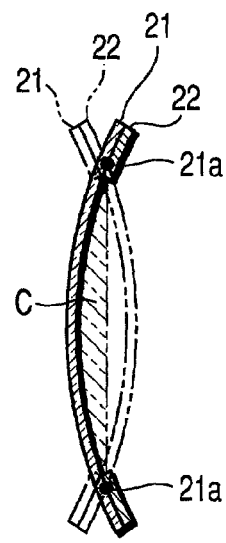
FIG. 8 is a sectional view taken along line VIII—VIII of FIG. 6, showing change of the state of the dust-off glass and the piezoelectric element caused when driving voltage is applied to the piezoelectric element of FIG. 6.

Further, FIGS. 7 and 8 show change of the state of the dust-off glass 21 and the piezoelectric element 22 caused when driving voltage is applied to the piezoelectric element 22 of FIG. 6. FIG. 7 is a sectional view taken along line VII—VII of FIG. 6, and FIG. 8 is a sectional view taken along line VIII—VIII of FIG. 6.

If a negative (minus; –) voltage is applied to the piezoelectric element 22, for example, the dust-off glass 21 is deformed in the manner indicated by dotted line in FIG. 8. In this case, the amplitude is practically zero in the respective positions of nodes of vibration designated by reference numeral 21a in FIGS. 6 to 8, so that the receiving portion 23c of the dust-off glass receiving member 23 is set to engage regions corresponding to the nodes 21a.

Thus, the dust-off glass 21 can be efficiently supported without inhibiting vibration of the dust-off glass 21. In this state, a dust-off glass drive portion 48 is controlled at a given time to apply a cyclic voltage to the piezoelectric element 22. Thereupon, the dust-off glass 21 vibrates, so that dust or the like adhering to the surface of the dust-off glass 21 is removed. The then resonance frequency is settled depending on the shape, thickness, material, etc. of the dust-off glass 21.

The aforesaid example shown in FIGS. 6 to 8 is a case where primary vibration is generated. Alternatively, however, vibration of a higher order may be generated.

The external appearance and fundamental mechanisms of the camera 1 have been described above with respect to particulars that are common to the individual embodiments. In the following, however, characteristic particulars will be described for each embodiment in the main.

(First Embodiment)

An optical apparatus (digital camera) having dust-off function according to a first embodiment of the present invention has the following circuit configuration.

In order to explain the operation of the vibrating means (dust-off glass drive circuit) with reference to a circuit diagram of the dust-off glass drive circuit 140 of the first embodiment shown in FIG. 9A, the drive of the dust-off glass of the camera having dust-off function and its operation control will be described with reference to the signal waveform time charts of FIGS. 10A to 10D.

The dust-off glass drive circuit 140 illustrated here has the circuit configuration shown in FIG. 9A, and signals (Sig1 to Sig4) with the waveforms represented by the time charts of FIGS. 10A to 10D are generated in its various parts. The circuit 140 is controlled in response to these signals in the following manner. More specifically, as illustrated, the dust-off glass drive circuit 140 comprises an N-ary counter 41, a ½ frequency divider 42, an inverter 43, a plurality of MOS transistors (Q00, Q01 and Q02) 44a, 44b and 44c, a transformer 45, and a resistor (R00) 46.

The signal (Sig4) with a given period is generated on the secondary side of the transformer 45 as the transistors (Q01) 44b and (Q02) 44c that are connected to the primary side of the transformer 45 are switched on and off. In response to this signal with the given period, the piezoelectric element 22 is driven to resonate the dust-off glass 21 (which will be described in detail later).

The Bucom 150 controls the dust-off glass drive circuit 140 in the following manner by means of two IO ports P_PwCont and D_NCnt and a clock generator 55 that exists in the Bucom 150. The clock generator 55 delivers a pulse signal (basic clock signal) to the N-ary counter 41 with a frequency higher enough than the frequency of the signal applied to the piezoelectric element 22. This output signal is the signal Sig1 with the waveform represented by the time chart of FIG. 10A. This basic clock signal is applied to the N-ary counter 41.

The N-ary counter 41 counts the pulse signals and outputs a count end pulse signal every time a given voltage "N" is reached. Thus, the frequency of the basic clock signal is divided into 1/N. This output signal is the signal Sig2 with the waveform represented by the time chart of FIG. 10B.

The high-low duty ratio of the frequency-divided pulse signal is not 1:1. Therefore, the duty ratio is converted into 1:1 by means of the ½ frequency divider 42.

The converted pulse signal corresponds to the signal Sig3 with the waveform represented by the time chart of FIG. 10C.

When the converted pulse signal is high, the transistor (Q01) 44b to which this signal is applied is turned on. On the other hand, this pulse signal is applied to the transistor (Q02) 44c via the inverter 43. Thus, when the pulse signal is low, the transistor (Q02) 44c to which this signal is applied is turned on. If the transistors (Q01) 44b and (Q02) 44c that are connected to the primary side of the transformer 45 are alternately turned on, a signal with a period such as that of the signal Sig4 shown in FIG. 10D is generated.

The winding ratio of the transformer 45 is settled depending on the output voltage of the unit of the power circuit 153 and a necessary voltage for the drive of the piezoelectric element 22. The resistor (R00) 46 is used to restrain excessive current from flowing through the transformer 45.

In driving the piezoelectric element 22, the transistor (Q00) 44a is expected to be on so that voltage from the unit of power circuit 153 is applied to the center tap of the transformer 45. The on/off control of the transistor (Q00) 44a in FIG. 9A is carried out by means of the IO port P_PwCont. The preset value "N" for the N-ary counter 41 can be set through the IO port D_NCnt. Thus, the Bucom 150 can freely change the driving frequency of the piezoelectric element 22 by suitably controlling the preset value "N".

The frequency can be calculated according to the following expression (1):

$$fdrv = fpls/2N, \qquad (1)$$

where N is the preset value for the counter, fpls is the frequency of the output pulse of the clock generator, and fdrv is the frequency of the signal applied to the piezoelectric element.

The computation based on this expression (1) is carried out by means of the CPU (control means) of the Bucom 150.

The following is a specific description of the control the body control microcomputer (Bucom) 150 for the camera.

Figure 11A:
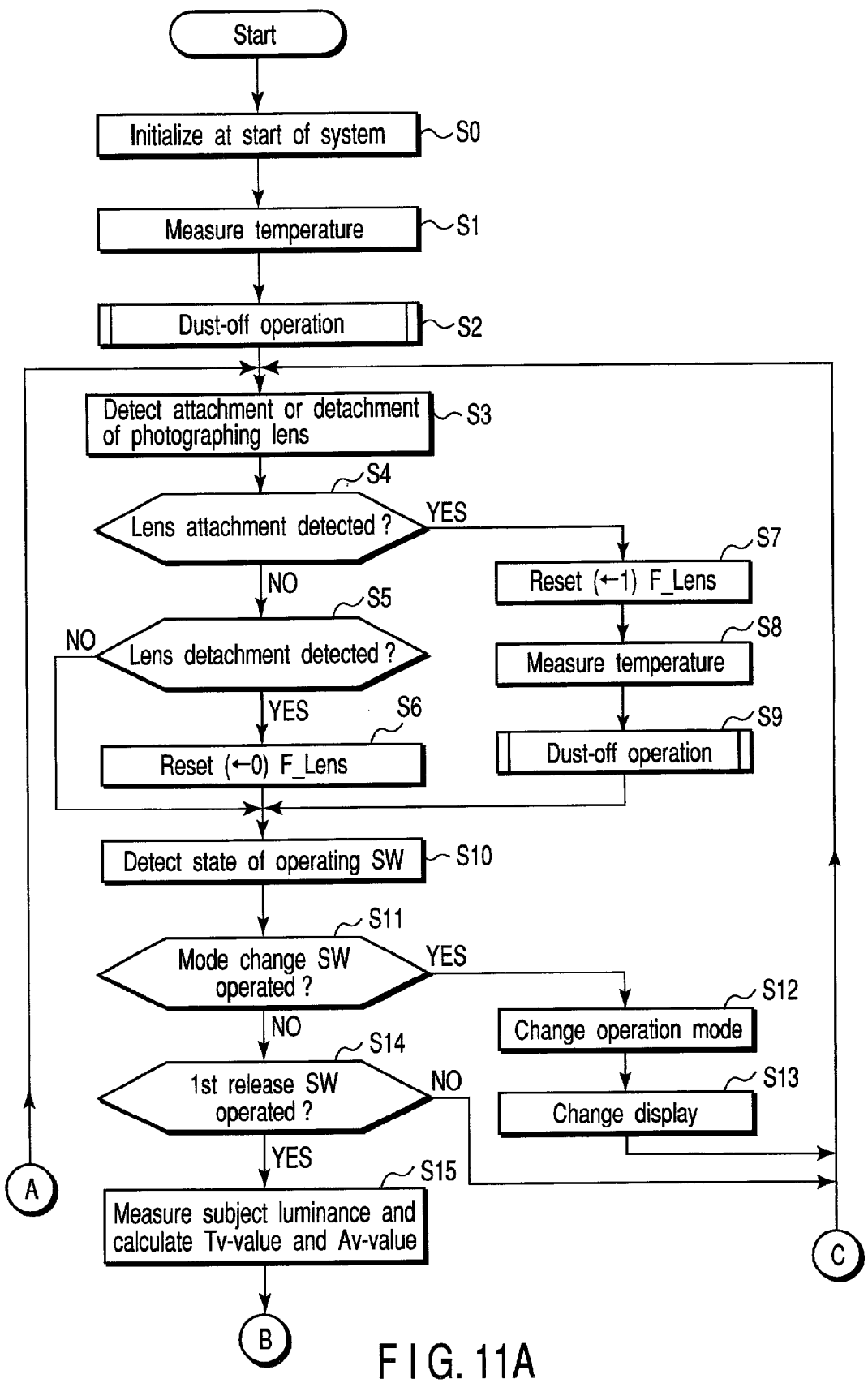
FIGS. 11A and 11B are flowcharts illustrating the main routine of a control program that is worked in a control element of the camera having dust-off function according to the first embodiment.
Figure 11B:
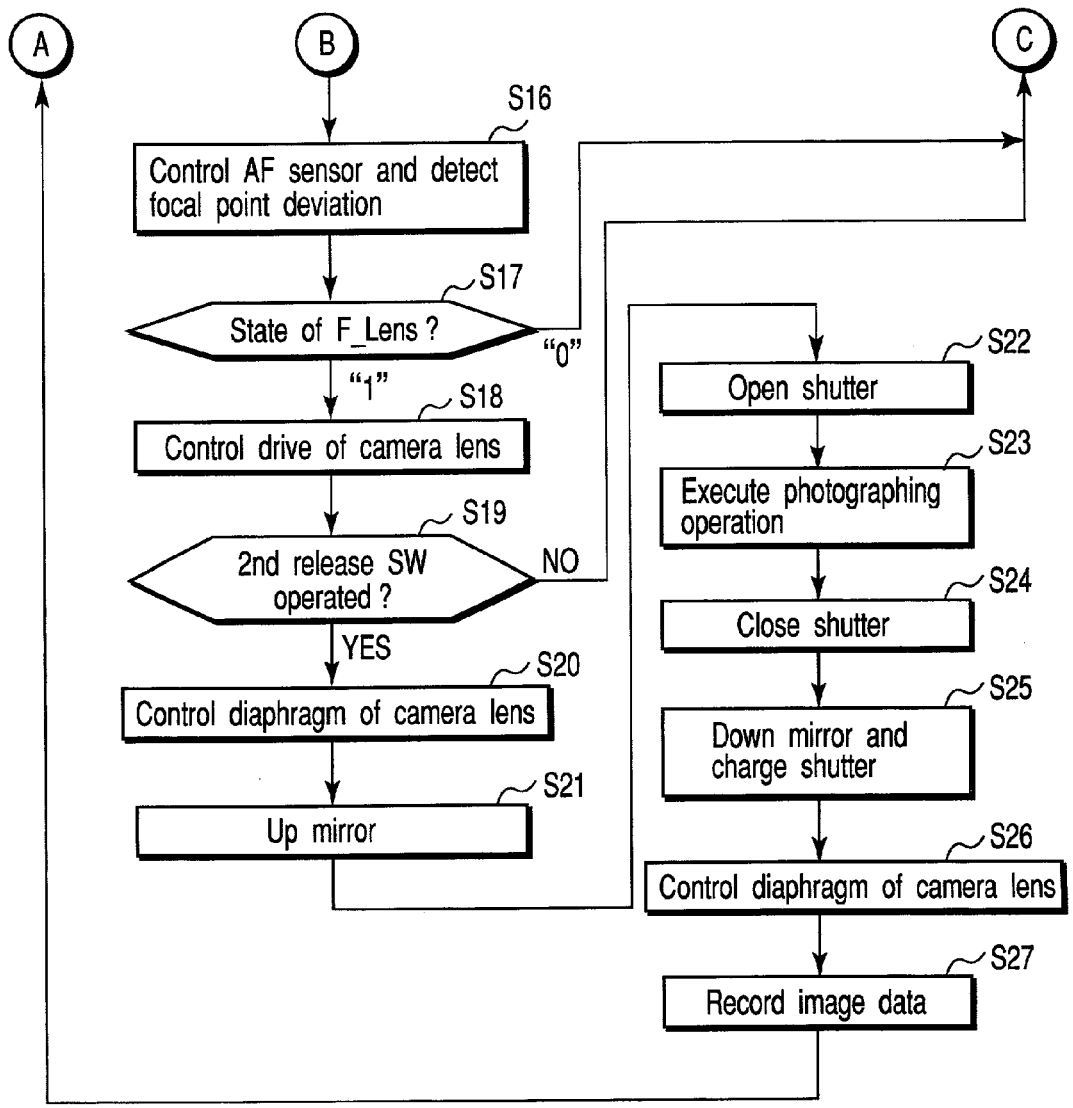

FIGS. 11A and 11B illustrate the main routine of a control program that is worked in the Bucom 150. When the power SW (not shown) of the camera 1 is first turned on, the Bucom 150 starts to operate, and a process for starting the camera system is executed in S0. The power circuit 153 is controlled to supply electric power to the individual circuit units that constitute the camera system. Further, the individual circuits are initialized.

In S1, the present temperature data is fetched from the temperature measuring circuit 133. This temperature data is information required in the subsequent operation routine of S2.

In S2, a subroutine "dust-off operation" is called and executed. Dust-off operation is executed by vibrating the dust-off glass 21 during this subroutine. By executing this operation when the power is turned on, dust having unexpectedly adhered to the dust-off glass 21 while the camera is not used for photographing can be removed. The operation of the subroutine will be described in detail later.

S3 is a step that is executed cyclically, and is an operating step for detecting the state of the lens barrel 12 through operation for communication with the Lucom 205. If it is detected in S4 that the lens barrel 12 is attached to the camera body 11, the program advances to S7. If it is detected that the lens barrel 12 is detached from the camera body 11, on the other hand, the program advances from S5 to S6. Then, a control flag F_Lens is reset, whereupon the program advances to S10.

In S7, the control flag F_Lens is set. This control flag represents "1" during a period in which the lens barrel 12 is attached to the camera body 11 and represents "0" during a period in which the lens barrel 12 is detached.

Operation for temperature measurement is carried out in S8, and the subroutine "dust-off operation" for removing dust from the dust-off glass 21 is called and executed in the directly subsequent step or S9. Thereupon, the program advances to S10.

Usually, dust adheres to the lenses, dust-off glass 21, etc. with high possibility during the period in which the lens barrel 12 is not attached to the camera body 11. It is to be desired, therefore, that dusting operation should be executed when the attachment of the lens barrel 12 is detected. Alternatively, the operations of S8 and S9 may be executed cyclically. According to this method, the dust-off glass 21 is often vibrated without any dust thereon, so that there is a high possibility of electric power being wasted. Thus, the dusting operation is executed depending on the performance of lens attaching operation.

The state of the camera operating SW 152 is detected in S10. If change of the state of the mode change SW (not shown) as one element of the camera operating SW 152 is detected in S110, the program advances to S12.

The operation mode of the camera is changed in association with the operation of the SW in S12, and information corresponding to the operation mode is outputted and displayed on an operation display LCD 151 in S13. Thereupon, the program returns to S3 described above.

In S14, whether or not a 1st release SW (not shown) as one element of the camera operating SW is operated is determined. If the 1st release SW is on, the program advances to S15. If it is off, the program returns to S3 described above.

In S15, luminance information on the subject is obtained from the photometric circuit 121. An exposure time (Tv-value) of the image-pickup element 27 and a preset aperture value (Av-value) of the photographing optical system 12a are calculated according to this information.

In S16, detection data on the AF sensor unit 116 is obtained via the AF sensor drive circuit 17. A deviation of the focal point is calculated in accordance with this data.

Then, in S17, the state of the F_Lens is determined. If the state is "0", then it implies that the lens barrel 12 is not present, so that the photographing operation in S18 and the subsequent steps cannot be executed. In this case, therefore, the program returns to S3 described above.

In S18, the deviation of the focal point is transmitted to the Lucom 205, and the drive of the photographing optical system 12a based on this deviation is ordered.

In S19, whether or not a 2nd release SW (not shown) as one element of the camera operating SW 152 is operated is determined. If the 2nd release SW is on, the program advances to S20, whereupon predetermined photographing operation is carried out. If it is off, the program returns to S3 described above.

In S20, the Av-value is first transmitted to the Lucom 205, and the drive of the stop 203 is ordered. In S21, the quick-return mirror (reflector) 13b is moved to its up position. A front-blind run of the shutter 14 is started in S22, and the image processing controller 28 is ordered to execute the photographing operation in S23. When exposure of the image-pickup element 27 for the time represented by the Tv-value is finished, a rear-blind run of the shutter 14 is started in S24, and the quick-return mirror 13b is driven to its down position in S25.

Further, the shutter 14 is charged in parallel with this.

In S26, the Lucom 205 is ordered to restore the stop 203 to its open position. In S27, the image processing controller 128 is ordered to record the photographed image data in the recording media 127. When recording the image data is finished, the program returns to S3 described above.

Figure 15A:
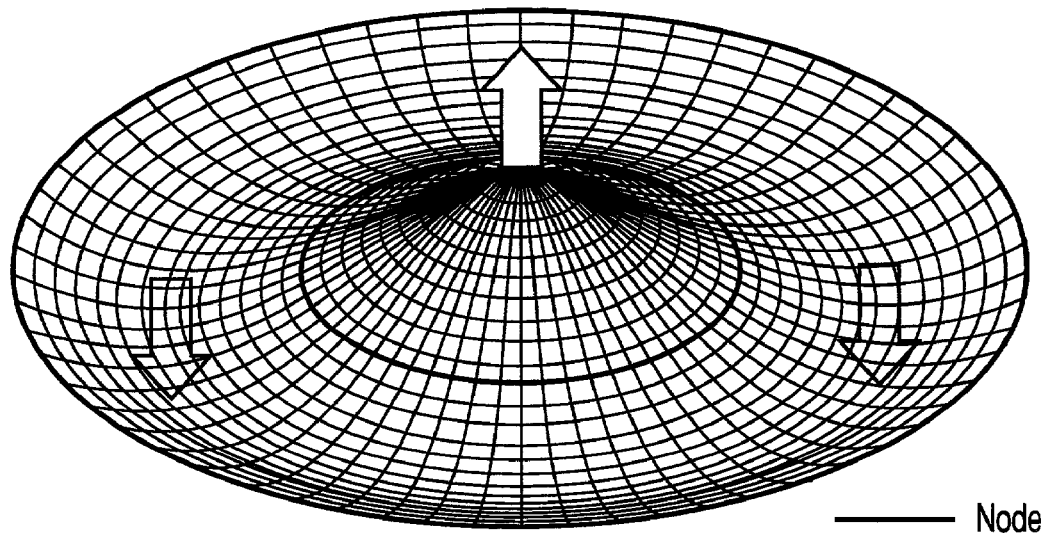
FIGS. 15A and 15B are diagrams showing states of vibration of the glass plate according to the present invention and illustrating a form (vibration mode 2) in which the inside and outside of the glass plate vibrate in diametrically opposite phases.
Figure 15B:
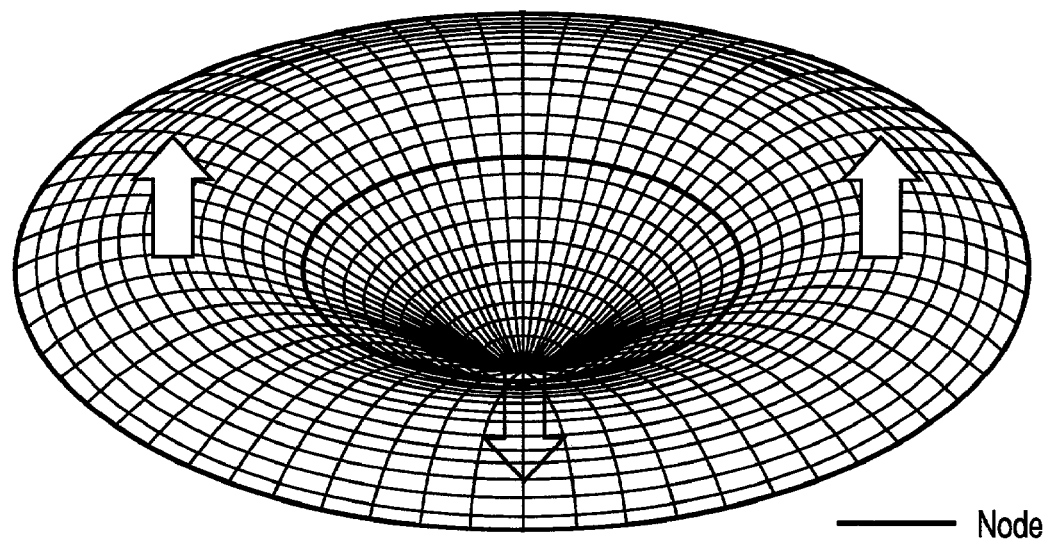

The support structure and vibration forms of the dust-off glass 21 will be described with reference to FIGS. 14A and 14B and FIGS. 15A and 15B. FIGS. 14A and 14B are diagrams showing the vibration forms of the dust-off glass (or glass plate) in selected vibration modes and illustrating a form (vibration mode 1) in which nodes are generated around the glass plate so that the whole surface vibrates in the same phase. FIGS. 15A and 15B are similar diagrams illustrating a form (vibration mode 2) in which the inside and outside of the glass plate vibrate in diametrically opposite phases.

In the camera system according to the present invention, the dust-off glass 21 is supposed to be disc-shaped. If the vibrating piezoelectric element 22 is located along the circumference of the glass plate of the dust-off glass 21, moreover, the glass plate is supported on the circumference. In this state, the glass plate can vibrate in a plurality of vibration modes (vibration forms). According to the present invention, two modes are selected out of these vibration modes and are used properly. FIGS. 14A and 14B and FIGS. 15A and 15B show states of vibration of the glass plate in the selected vibration modes.

The dust-off glass 21 is in the vibration forms shown in FIGS. 14A and 14B, individually. If the glass plate is subjected to vibration by means of the piezoelectric element 22 that serves as the vibrating means, it is surrounded by "nodes" that are free from vibration. However, the substantially whole glass surface vibrates in the same phase, alternately repeating the states of FIGS. 14A and 14B as indicated by thick arrows. These vibration forms will hereinafter be referred to as "vibration mode 1".

Likewise, the dust-off glass 21 of the first embodiment can also vibrate in the forms shown in FIGS. 15A and 15B, individually, depending on the frequency of vibration applied. Thus, in the vibration forms of the dust-off glass 21 illustrated in FIGS. 15A and 15B, the inside and outside of the glass plate vibrate in diametrically opposite phases. More specifically, in the illustrated vibration forms, nodes are generated individually around and inside the glass plate, and the respective phases of the vibration of the region surrounded by the inside nodes and the vibration of the region (doughnut-shaped region) outside the internal nodes are deviated at 180° from each other. These forms will hereinafter be referred to as "vibration mode 2".

Figure 12A:
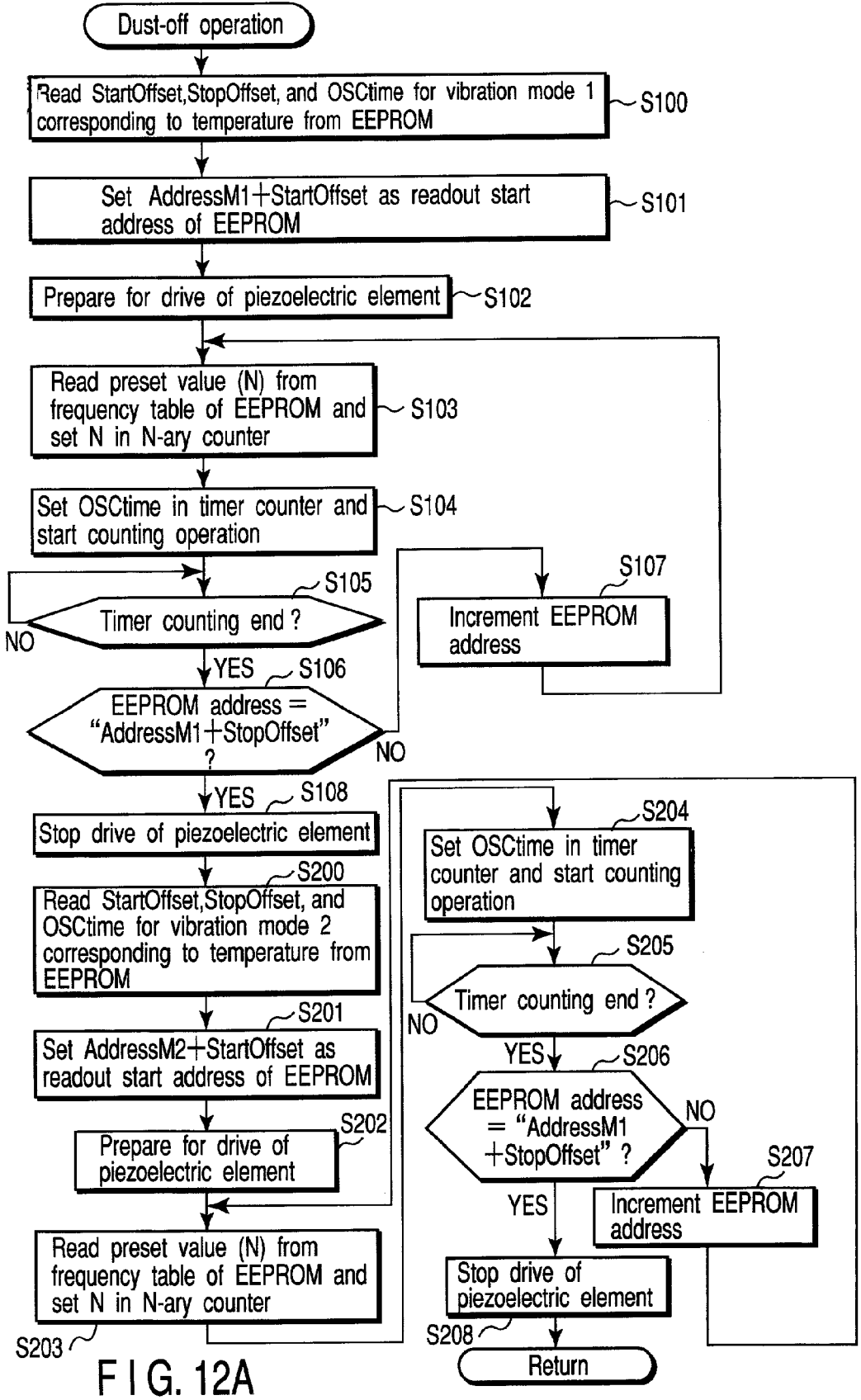
FIG. 12A is a flowchart illustrating in detail steps of procedure of a subroutine "dust-off operation" according to the first embodiment.

Then, in the subroutine "dust-off operation" of the camera 1 according to the first embodiment shown in the flowchart of FIG. 12A, the piezoelectric element 22 is set to be driven so that the dust-off glass 21 is resonated in the two modes, the vibration mode 1 and the vibration mode 2.

In general, the frequency and amplitude that facilitate the removal of dust vary depending on the properties (e.g., weight, shape, material, etc.) of the dust. Therefore, the dust can be securely removed by resonating the glass plate in these two vibration modes. Naturally, the glass plate may be resonated in an additional number of vibration modes. Since the removal operation may correspondingly take more time in some cases, however, a suitable number of vibration modes should be set fully in consideration of the degree of the removal effect and the required time.

Accordingly, the "dust-off operation" characteristic of the first embodiment will be described with reference to the flowchart of FIG. 12A and FIGS. 16 to 19.

In S100, three control parameters (StartOffset, StopOffset, and OSCtime) are read from the EEPROM 129.

These three control parameters can be read from a "temperature correction table for vibration mode 1" that is stored in the EEPROM shown in the memory map of FIG. 1.

Figures 16, 17A, 17B:
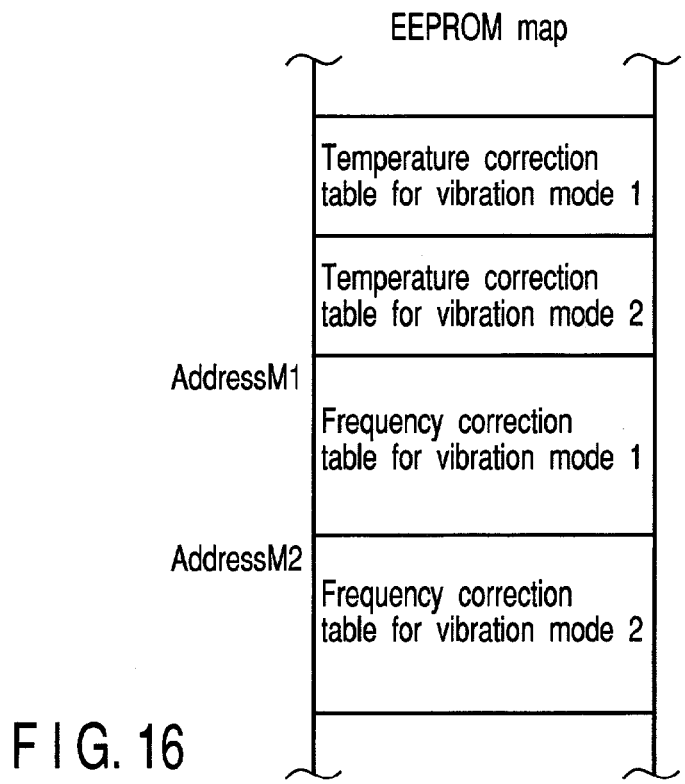

FIG. 17A shows the details of the temperature correction table for vibration mode 1. Temperature information (t) is needed to read corresponding control parameters from this temperature correction table. The temperature information (t) is detected and obtained by means of a temperature sensor of the temperature measuring circuit 133 (see S1 or S8 of FIG. 11A) before the execution of this subroutine.

If the then control parameters are read from (*0) in the temperature correction table for vibration mode 1 of FIG. 17A in the case where the temperature information (t) is 20° C., for example, a readout start position (StartOffset), readout end position (StopOffset), and time interval (OscTime) are obtained corresponding to "3", "9" and "100", respectively. A region for the temperature correction table for vibration mode 1 of the EEPROM 129 is defined by the respective values of the StartOffset and the StopOffset. Further, the values are successively set in the N-ary counter 41 with the time interval (100 msec in this case) read from this region.

FIGS. 18A and 18B show frequency correction tables corresponding to these vibration modes. FIG. 18A is a frequency correction table for vibration mode 1, and FIG. 18B is a frequency correction table for vibration mode 2.

The frequency correction table for vibration mode 1 is calculated on the supposition that the clock generator 55 outputs pulse signals with a frequency of 40 (mHz).

The driving frequency can be calculated by using the aforementioned expression (1). Based on a value read from the aforesaid temperature correction table, seven preset values for regions *1 to *2 of the frequency correction table for vibration mode 1 are successively set in the N-ary counter 41. A curve *3 in FIG. 19 is obtained by plotting the relations between driving frequencies f1, f2, . . . , f7 for that time and the amplitude of the vibration of the glass plate as a graph.

Figures 19, 20A, 20B:
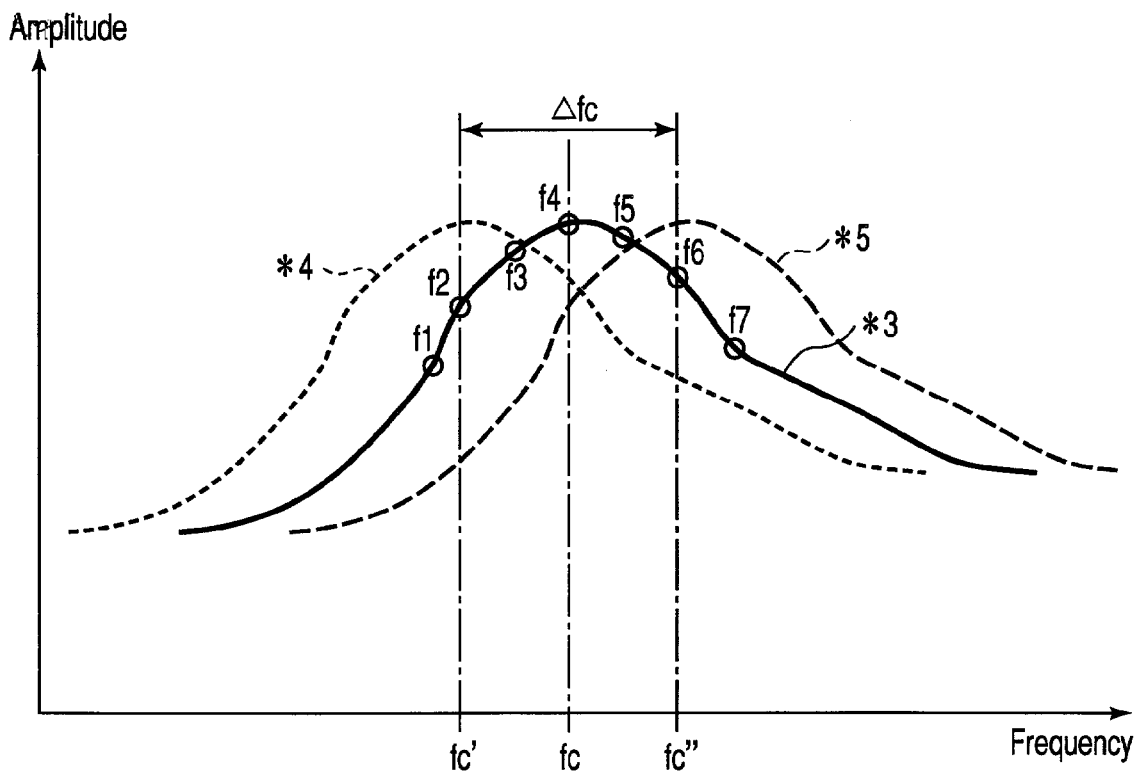

FIG. 19 shows characteristic graphic curves representing the relations between driving frequencies fn and the amplitude of the vibration of the glass plate. A correction range (fc'<fc<fc") for the resonance frequency is indicated mainly by the plotted graphic curve *3.

In the graphic curve *3, fc is the resonance frequency. The value fc happens to be equal to f4. In the case of a glass plate that has a characteristic represented by *4, for example, fc' is the resonance frequency, and fc' is equal to f2. In the case of a glass plate that has a characteristic represented by *5, for example, fc" is the resonance frequency, and fc" is equal to f6.

Thus, if the readout start position (StartOffset) and the readout end position (StopOffset) of the frequency correction table are set in consideration of the variation of the resonance frequency within the range of Δfc, a situation for the vibration of the glass plate with the resonance frequency never fails to be realized.

It is evident, moreover, that the glass plate can surely be driven by properly setting the temperature correction table for vibration mode 1 shown in FIG. 16 even if Δfc varies depending on temperature.

The following is a description of the flowchart of FIG. 12A according to the first embodiment.

If the value of the OSCtime is enhanced, the vibrating time in a resonant state can be set optionally. However, ineffective vibrating operation (e.g., drive with any other frequency than the resonance frequency) takes more time, and therefore, must be noticed.

In S101, AddressM1+StartOffset is set as a readout start address of the EEPROM 129 in FIG. 16. AddressM1 represents the top address of the frequency correction table for vibration mode 1. Thus, AddressM1+StartOffset corresponds to *1 in FIG. 18A.

In S102, preparatory operation for the drive of the piezoelectric element 22 is carried out. The IO port P_PwCont is controlled to turn on the transistor Q00. Further, delivery of pulse signals from the clock generator 55 is started. If data fetched from the tables are set in the N-ary counter 41 in this state, the piezoelectric element 22 can be driven with a desired frequency.

In S103, a preset value (N) is read from the set address. Then, the preset value read out to the N-ary counter 41 is set through the IO port D_NCnt.

In S104, the OSCtime is set in a timer counter, whereupon counting operation of a timer is started. In S105, termination of the operation of the timer counter is awaited.

In S106, whether or not the address of the EEPROM 129 is equal to "AddressM1+StopOffset" is determined. If the two values are equal, then it implies that table data up to *2 of FIG. 18A are read. Thus, the vibrating operation with a plurality of predetermined frequencies can be concluded to have been finished. In this case, therefore, processing for stopping driving operation is carried out in S108. The transistor Q00 is turned off to stop the operation of the clock generator 55.

When the program advances from S106 to S107, the address of the EEPROM 129 is incremented (+1). In order to drive the piezoelectric element 22 with the next frequency, the program returns to S103.

When driving operation corresponding to the vibration mode 1 terminates, the steps of operation of S200 to S208 are executed for driving operation corresponding to the vibration mode 2.

The necessary control parameters StartOffset, StopOffset, and OSCtime for the vibration of the glass plate in the vibration mode 2 should only be read from the temperature correction table for vibration mode 2 in the EEPROM shown in FIG. 17B.

The preset value (N) should only be read from the frequency correction table for vibration mode 2. Likewise, the details of the frequency correction table for vibration mode 2 are shown in FIG. 18B.

Basically, the subsequent steps of operation of S200 to S208 are identical with the aforesaid steps of operation of S100 to S108. The difference lies only in the address of the EEPROM 129 from which the necessary table for the control is read. Therefore, a description of those steps is omitted.

When the vibrating operation for the dust-off glass 21 in the two vibration modes is finished, the program returns to the main routine.

In the stage of designing the camera system, it is very hard to estimate the variation of the resonance frequency of the glass plate. Accordingly, the camera system should be designed so that the control parameters that settle the driving frequency of the piezoelectric element 22 can be after it is completed. According to the present invention, as mentioned before, therefore, all the necessary parameters are selectively stored in the EEPROM 129.

Thus, the optical apparatus (e.g., camera) having dust-off function according to the first embodiment comprises the image-pickup element 27 that constitutes a CCD unit for photoelectrically converting the subject image, the optical element (dust-off glass 21) located between the image-pickup element 27 and the photographing optical system 12a, and the vibrating means (e.g., piezoelectric element 22) for vibrating the dust-off glass 21 with a given frequency. Preferably, the image-pickup element 27 is integrally held in a frame in the form of a case. When the piezoelectric element 22 vibrates the dust-off glass 21 by means of the dust-off glass drive circuit 140, suitable control carried out gradually to change the frequency of the vibration. By doing this, the surface of the dust-off glass 21 repeatedly vibrates with a plurality of types of given frequencies in the same phase or diametrically opposite phases. In consequence, dust adhering to the glass surface is removed.

Thus, there may be provided a camera in which dust can be efficiently removed only in consideration of the measured ambient temperature without adjusting, for example, variations in the glass shape, modulus of elasticity, etc. that influence the resonance frequency of the dust-off glass 21 as a protective glass.

Further, labor and cost for the adjustment of the undamped natural frequency, attributable to the variation of a glass member such as a protective glass whose resonance frequency cannot be specified, are unnecessary.

(Modification 1)

Figure 21A:
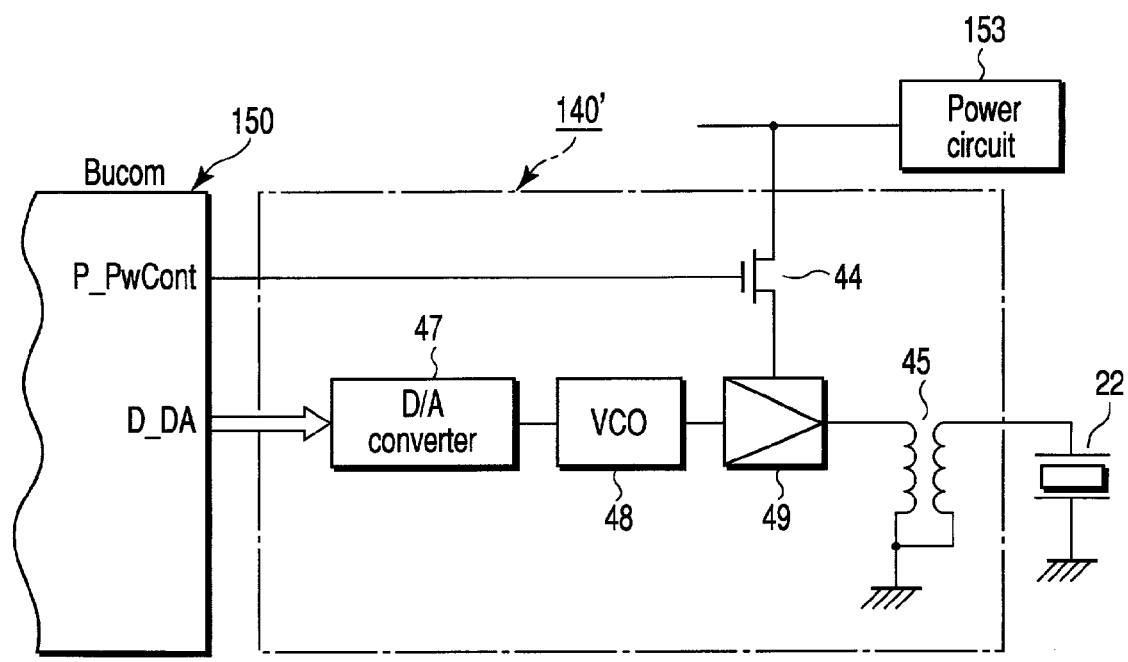
FIG. 21A is a circuit diagram showing a circuit configuration of vibrating means (dust-off glass drive circuit) as a modification of the first embodiment.

The following is a description of a modification of the first embodiment of the present invention. The foregoing first embodiment may be carried out in the following manner. A circuit diagram illustrated in FIG. 21A shows a configuration of vibrating means (dust-off glass drive circuit 140') as a modification of the first embodiment. Characteristic portions will now be described without involving a repeated description.

The foregoing first embodiment is carried out in a manner such that the driving frequency is changed by controlling the dividing ratio of the N-ary counter 41. According to this modification, in contrast with this, the dust-off glass drive circuit 140' is composed of a circuit such as the one shown in FIG. 21A. This modification is carried out in a manner such that the driving frequency is changed by the use of the D/A converter 47 and a VCO (voltage control oscillator) 48.

As shown in FIG. 21A, the dust-off glass drive circuit 140' comprises the D/A converter 47 connected to an output port D_DA of the Bucom 150, the VCO (voltage control oscillator) 48 connected to the converter 47, an amplifier 49 connected to the VCO 48, and a transistor 44 and the transformer 45 connected to the amplifier 49. The base of the transistor 44 is connected to an output port P_PWCont of the Bucom 150, and necessary electric power is supplied from the power circuit 153. The piezoelectric element 22 is connected to the transformer 45 so that the glass plate can be vibrated with predetermined vibration.

In this circuit configuration, a signal given from the output port D_DA is converted into an analog signal by means of the D/A converter 47, and a signal with a given period is oscillated by means of the VCO (voltage control oscillator) 48 in response to the converted signal. After this signal is amplified by means of the amplifier 49, the piezoelectric element 22 is vibrated with the driving frequency fc (fn) by means of a secondary-side voltage that is obtained by supplying the amplified signal to the primary side of the transformer 45. Since the driving frequency fc can be changed within the range from fc' to fc" shown in FIG. 19 by suitably changing the preset value of the D/A converter 47, the same control of the foregoing first embodiment can be effected. Thus, there may be provided a camera in which dust can be removed efficiently.

Although there have been described the camera system capable of electronic image-pickup and the protective glass (dust-off glass) by way of example, the present invention can be also applied to any other optical apparatuses that can be easily damaged by dust or dirt with the same effects as those of the foregoing first embodiment.

Further, any other optical element members than glass whose resonance frequency cannot be specified is applicable. Also in this case, adjustment of the undamped natural frequency attributable to the variation of individual products is unnecessary, so that the same effect as aforesaid can be expected.

(Second Embodiment)

Figure 9B:
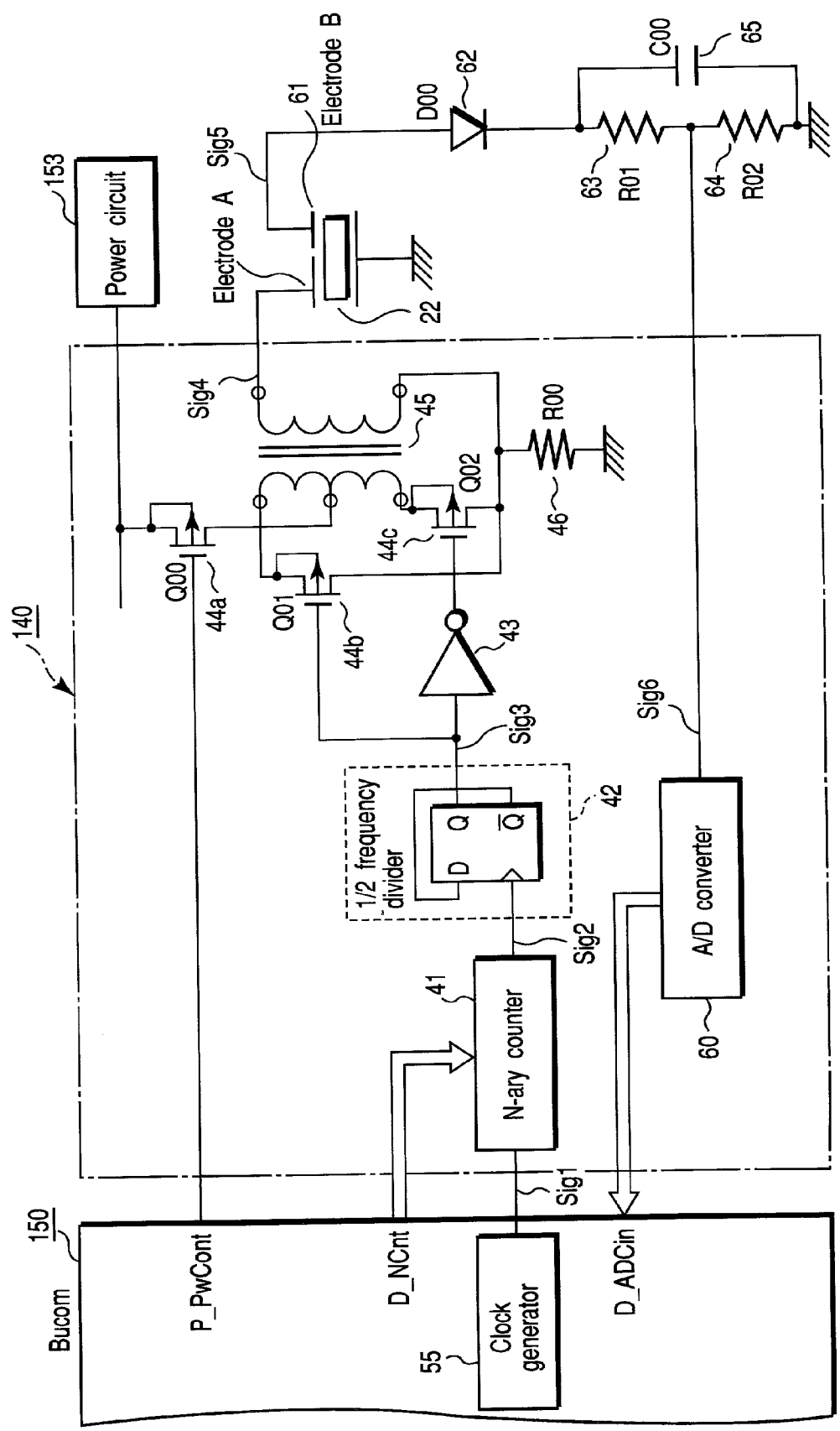
FIG. 9B is a circuit diagram of a dust-off glass drive circuit of the camera having dust-off function according to the second or third embodiment.

An optical apparatus (digital camera) having dust-off function according to a second embodiment of the present invention is a camera that substantially shares the external appearance and fundamental mechanisms with the camera 1 of the foregoing first embodiment, and has the circuit configuration shown in FIG. 9B.

The drive of the dust-off glass 21 of the camera having dust-off function according to the second embodiment and its operation and control will be described with reference to a circuit diagram of a dust-off glass drive circuit 140 shown in FIG. 9B and the time charts of FIGS. 10A to 10F.

The dust-off glass drive circuit 140 illustrated here has the circuit configuration shown in FIG. 9B, and signals (Sig1 to Sig6) with the waveforms represented by the time charts of FIGS. 10A to 10F are generated in its various parts. The circuit 140 is controlled in response to these signals in the following manner. More specifically, as illustrated in FIG. 9B, the dust-off glass drive circuit 140 comprises an N-ary counter 41, a ½ frequency divider 42, an inverter 43, a plurality of MOS transistors (Q00, Q01 and Q02) 44a, 44b and 44c, a transformer 45, a resistor 0(R00) 46, an A/D converter 60, resistors (R01 and R02) 63 and 64, and a capacitor (C00) 65.

The signal (Sig4) with a given period is generated on the secondary side of the transformer 45 as the transistors (Q01) 44b and (Q02) 44c that are connected to the primary side of the transformer 45 are switched on and off. In response to this signal with the given period, the piezoelectric element 22 having two electrodes A and B is driven variously driven to find out an efficient resonance frequency and resonate the dust-off glass 21 effectively (which will be described in detail later).

The Bucom 150 controls the dust-off glass drive circuit 140 in the following manner by means of two IO ports P_PwCont and D_NCnt and a clock generator 55 that exists in the Bucom 150. The clock generator 55 delivers a pulse signal (basic clock signal) to the N-ary counter 41 with a frequency higher enough than the frequency of the signal applied to the piezoelectric element 22. This output signal is the signal Sig1 with the waveform represented by the time chart of FIG. 10A.

This basic clock signal is applied to the N-ary counter 41.

The N-ary counter 41 counts the pulse signals and outputs a count end pulse signal every time a given voltage "N" is reached. Thus, the frequency of the basic clock signal is divided into 1/N. This output signal is the signal Sig2 with the waveform represented by the time chart of FIG. 10B.

The high-low duty ratio of the frequency-divided pulse signal is not 1:1. Therefore, the duty ratio is converted into 1:1 by means of the ½ frequency divider 42.

The converted pulse signal corresponds to the signal Sig3 with the waveform represented by the time chart of FIG. 10C.

When the converted pulse signal is high, the transistor (Q01) 44*b* to which this signal is applied is turned on. On the other hand, this pulse signal is applied to the transistor (Q02) 44*c* via the inverter 43. Thus, when the pulse signal is low, the transistor (Q02) 44*c* to which this signal is applied is turned on.

If the transistors (Q01) 44*b* and (Q02) 44*c* that are connected to the primary side of the transformer 45 are alternately turned on, a signal with a period such as that of the signal Sig4 shown in FIG. 10D is generated.

The winding ratio of the transformer 45 is settled depending on the output voltage of the unit of the power circuit 153 and a necessary voltage for the drive of the piezoelectric element 22. The resistor (R00) 46 is used to restrain excessive current from flowing through the transformer 45.

In driving the piezoelectric element 22, the transistor (Q00) 44*a* is expected to be on so that voltage from the unit of power circuit 153 is applied to the center tap of the transformer 45. The on/off control of the transistor (Q00) 44*a* in FIG. 9B is carried out by means of the 10 port P_PwCont. The preset value "N" for the N-ary counter 41 can be set through the IO port D_NCnt. Thus, the Bucom 150 can freely change the driving frequency of the piezoelectric element 22 by suitably controlling the preset value "N".

The frequency can be calculated in like manner according to the aforesaid expression (1).

Naturally, the computation based on this expression (1) is carried out by means of the CPU (control means) of the Bucom 150.

An electrode B61 is an electrode of the piezoelectric element for detecting the state of vibration of the glass plate. An alternating voltage (monitor signal) corresponding to the state of vibration of the glass plate is generated from the electrode B61. This is Sig5 on the time chart of FIG. 10E.

A diode (D00) 62 that is connected to the electrode B61 is provided for the half-wave rectification of the monitor signals. Further, the resistors (R01 and R02) 63 and 64 and the capacitor (C00) 65 form an envelope of the monitor signals. The optimum value of a time constant that is determined by a detection circuit formed of the resistors (R01 and R02) 63 and 64 and the capacitor (C00) 65 varies depending on the oscillation frequency of the glass. The glass plate of the first embodiment is driven in two resonance modes (first and second drive modes). If driving frequencies for these two resonance modes are greatly different, the circuit configuration used must be designed so that the time constant can be changed. The resistors (R01 and R02) 63 and 64 attenuate the monitor signals to a level such that they can be applied to the A/D converter 60. This signal is Sig6 on the time chart of FIG. 10F.

This signal is converted into digital data in the A/D converter 60 and read from an input port D_DACin of the Bucom 150. The Bucom 150 must only change the value to be set in the N-ary counter 41 so that the monitor signals are on its maximum level. Dust can be removed efficiently if the glass is driven with the value (resonance frequency) in the N-ary counter 41 that represents the maximum level.

A control program according to the second embodiment has the following features.

Figure 11C:
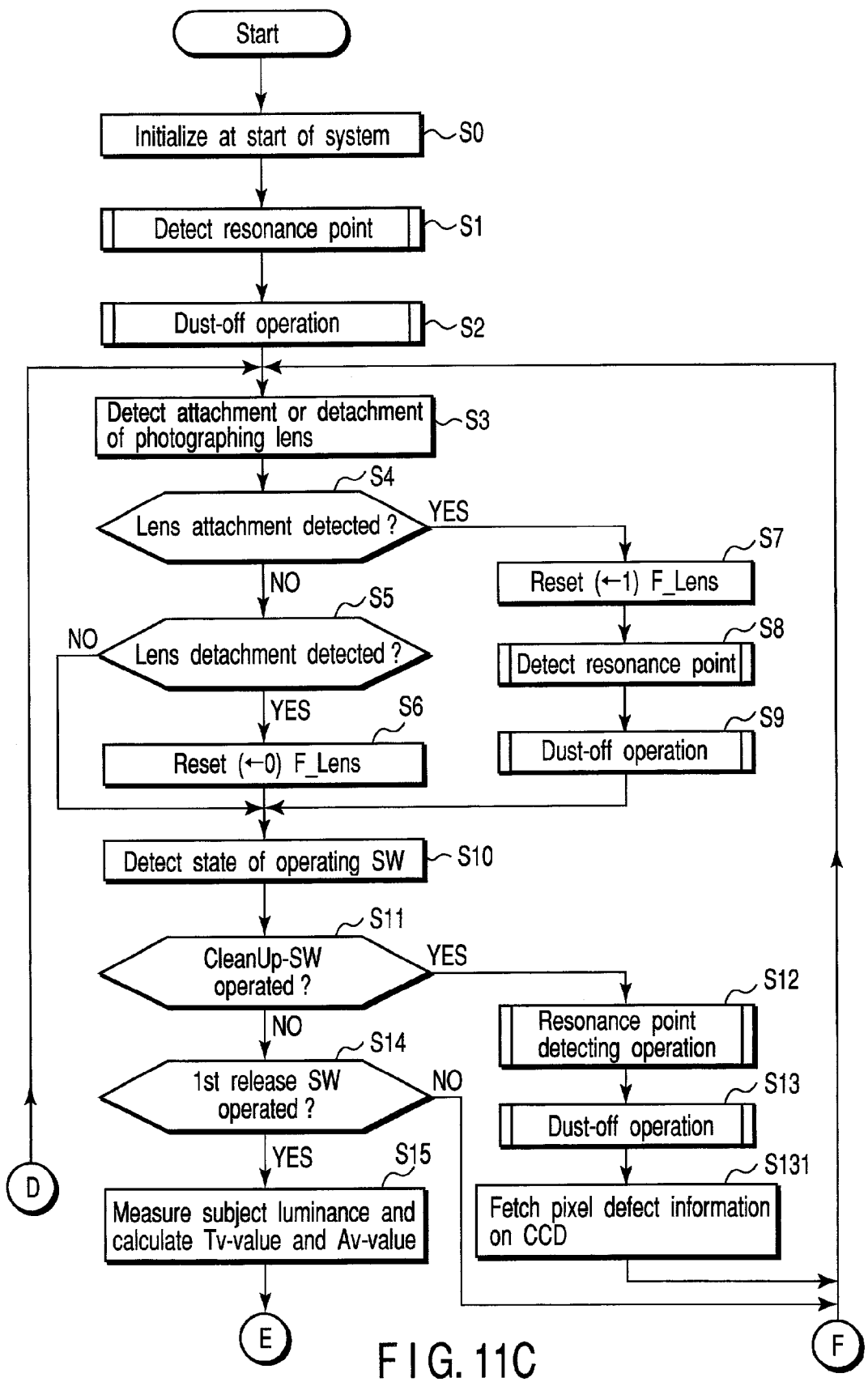
FIGS. 11C and 11D are flowcharts illustrating the main routine of a control program that is worked in a control element of the camera having dust-off function according to the second or third embodiment.
Figure 11D:
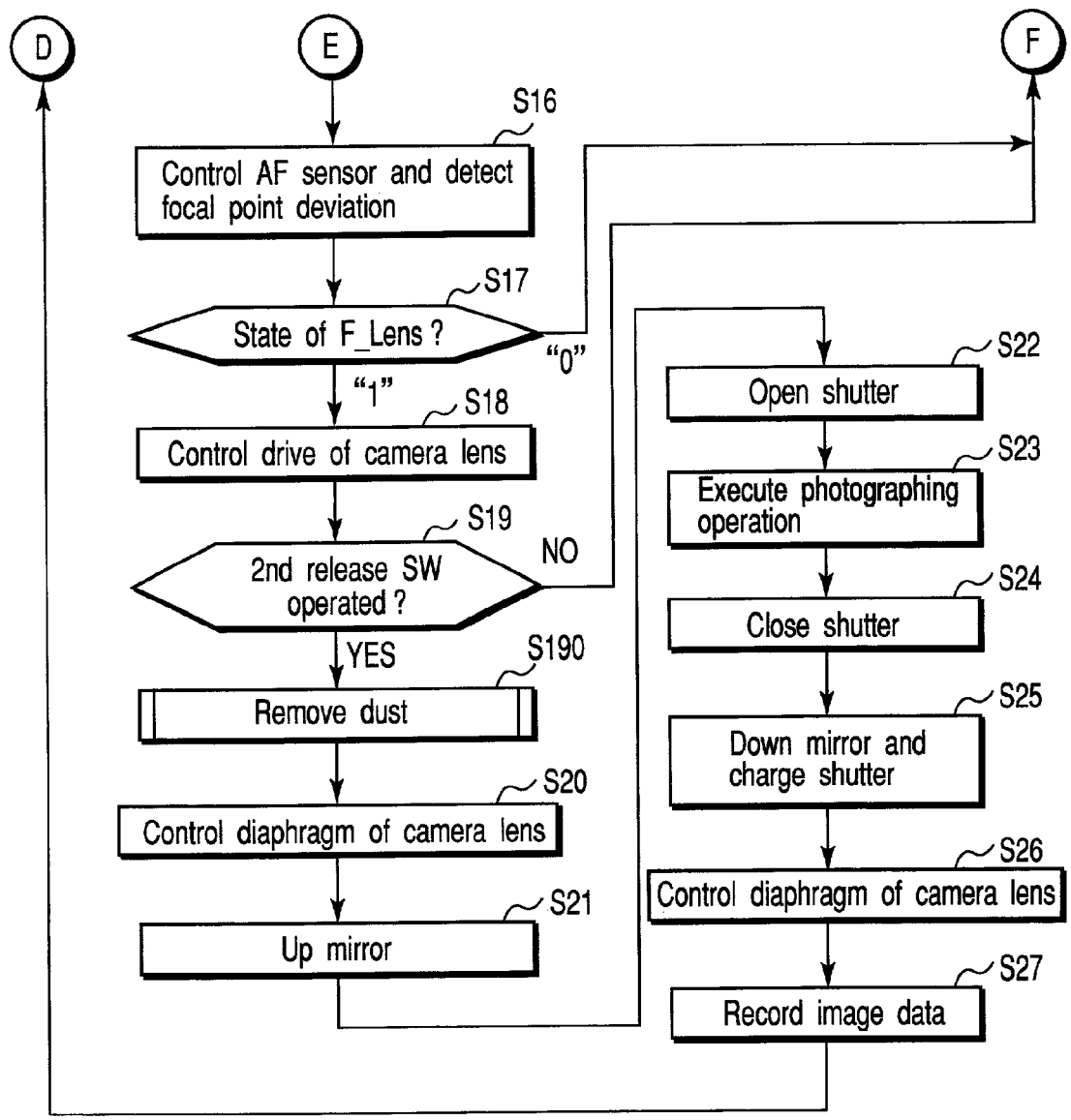

In order to explain control by means of the aforesaid camera body control microcomputer (Bucom) 50 specifically, the main routine of the control program that is worked in the Bucom 150 is illustrated in FIGS. 11C and 11D.

When the power SW (not shown) of the camera is first turned on, the Bucom 150 starts to operate, and a process for starting the camera system is executed in S0. The power circuit 153 is controlled to supply electric power to the individual circuit units that constitute the camera system. Further, the individual circuits are initialized.

In S1, a subroutine "resonance point detecting operation" that is characteristic of the present invention is called and executed. In this subroutine, a suitable driving frequency (resonance frequency) for efficient vibration of the dust-off glass 21 is detected (which will be described in detail later). This frequency data is stored in a memory region with a given address of the Bucom 150.

In S2, a subroutine "dust-off operation" is called and executed. During this subroutine, the user can remove dust, having unexpectedly adhered to the dust-off glass 21 while the camera is not used for photographing, by vibrating the dust-off glass 21 with the resonance frequency detected in S1 and shaking off the dust adhering to the glass surface.

S3 is a step that is executed cyclically, and is an operating step for detecting the state of the lens barrel 12 through operation for communication with the Lucom 205. If it is detected in S4 that the lens barrel 12 is attached to the camera body 11, the program advances to S7. If it is detected that the lens barrel 12 is detached from the camera body 11, on the other hand, the program advances from S5 to S6. Then, a control flag F_Lens is reset, whereupon the program advances to S10.

In S7, the control flag F_Lens is set. This control flag represents "1" during a period in which the lens barrel 12 is attached to the camera body 11 and represents "0" during a period in which the lens barrel 12 is detached.

The subroutine "resonance point detecting operation" is called and executed in the same manner as aforesaid in S8, and the subroutine "dust-off operation" for removing dust from the dust-off glass 21 is called and executed in like manner in the directly subsequent step or S9.

As is generally known, dust adheres to the lenses, dust-off glass 21, etc. with high possibility during the period in which the lens barrel 12 is not attached to the camera body 11. It is to be desired, therefore, that dusting operation should be executed when the attachment of the lens barrel 12 is detected. If the lenses are replaced, the outside air circulates in the camera and changes the temperature in the camera, whereupon the resonance frequency of the glass also changes. In S8, therefore, the aforesaid "resonance point detecting operation" is executed to settle a new driving frequency (resonance frequency). Then, in the directly subsequent step or S9, the "dust-off operation" is executed with the settled frequency.

The state of the camera operating SW 52 is detected in S10. If change of the state of a CleanUp-SW (not shown) as one element of the camera operating SW 52 is detected in the next step or S110, the program advances to S12.

In S12 and S13, operation for removing dust from the dust-off glass 21 is executed. In association with the operation of S12, operation for fetching CCD pixel defect information is executed in S13. This defective pixel information is stored in the FlashRom 126 and used for the correction of image data. If dust adheres to the glass, the defect information cannot be obtained accurately. Prior to the operation of S131, therefore, a series of operations of S12 and S13 is executed in the same manner as aforesaid.

In S14, whether or not a 1st release SW (not shown) as one element of the camera operating SW is operated is determined. If the 1st release SW is on, the program advances to S15. If it is off, the program returns to S3 described above.

In S15, luminance information on the subject is obtained from the photometric circuit 21. An exposure time (Tv-value) of the image-pickup element 27 and a preset aperture value (Av-value) of the photographing optical system 12a are calculated according to this information.

In S16, detection data on the AF sensor unit 16 is obtained via the AF sensor drive circuit 17. A deviation of the focal point is calculated in accordance with this data.

Then, in S17, the state of the F_Lens is determined. If the state is "0", then it implies that the lens barrel 12 is not present, so that the photographing operation in the next step or S18 and the subsequent steps cannot be executed. In this case, therefore, the program returns to S3 described above.

In S18, the deviation of the focal point is transmitted to the Lucom 205, and the drive of the photographing optical system 12a based on this deviation is ordered.

In S19, whether or not a 2nd release SW (not shown) as one element of the camera operating SW 52 is operated is determined. If the 2nd release SW is on, the program advances to the next step or S190, whereupon predetermined photographing operation is carried out. If it is off, the program returns to S3 described above.

In S190, the "dust-off operation" routine is executed to remove dust before the photographing operation. In order to avoid a time lag attributable to this operation, however, the "resonance point detecting operation" routine is not executed in this case. For secure dusting, it is to be desired that the operations based on these two routines should be executed jointly. If there is no possibility of the resonance frequency changing, however, the "resonance point detecting operation" routine may be omitted. However, this does not apply to cases for the starting of the camera system, lens replacement, and CCD pixel defect detecting operation.

In S20, the Av-value is first transmitted to the Lucom 205, and the drive of the stop 203 is ordered. In S21, the quick-return mirror 13b is moved to its up position. A front-blind run of the shutter 14 is started in S22, and the image processing controller 28 is ordered to execute the photographing operation in S23. When exposure of the image-pickup element 27 for the time represented by the Tv-value is finished, a rear-blind run of the shutter 14 is started in S24, and the quick-return mirror 13b is driven to its down position in S25. Further, the shutter 14 is charged in parallel with this.

In S26, the Lucom 205 is ordered to restore the stop 203 to its open position. In S27, the image processing controller 28 is ordered to record the photographed image data in the recording media 27. When recording the image data is finished, the program returns to S3 described above.

Figure 13A:
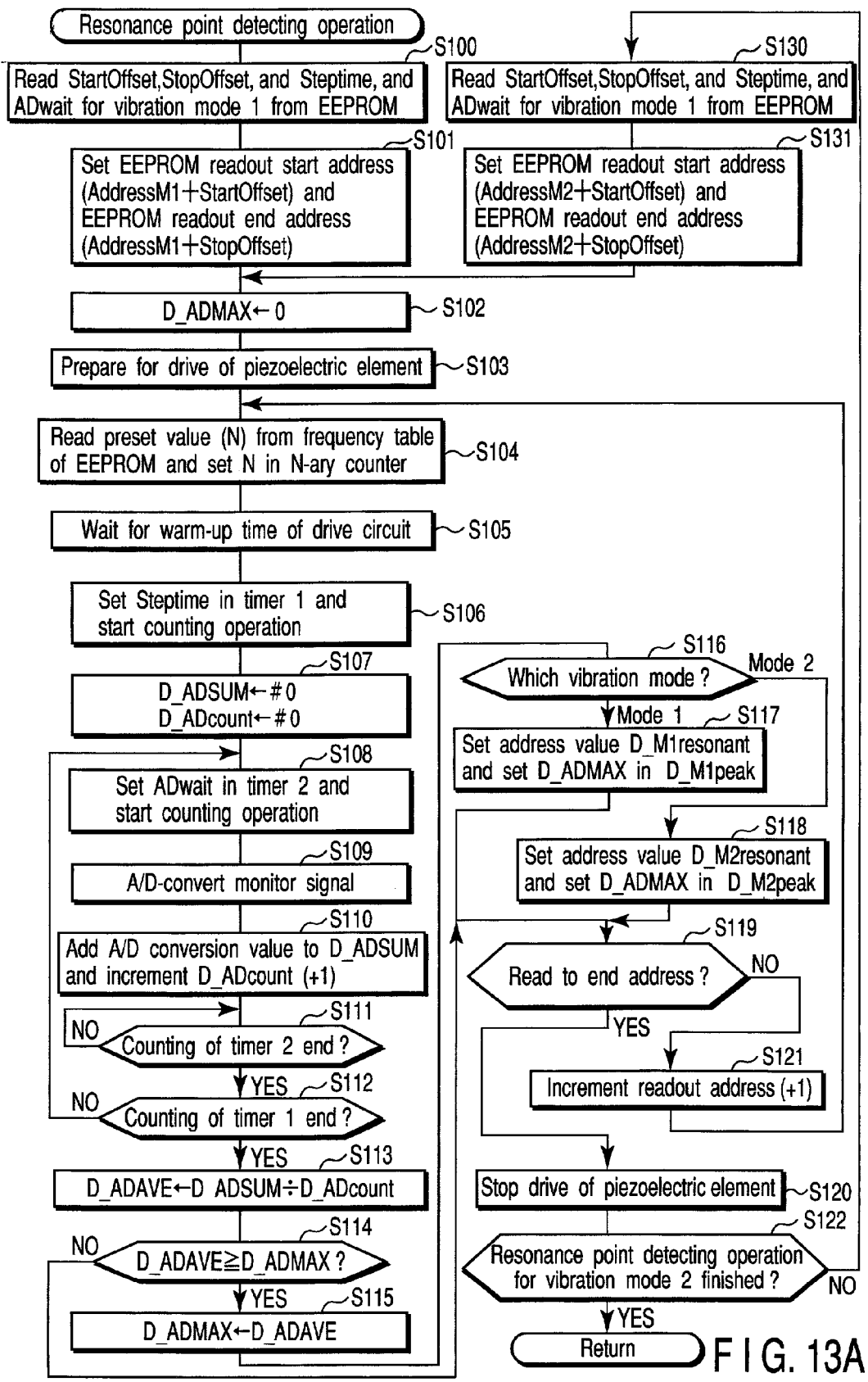
FIG. 13A is a flowchart illustrating in detail steps of procedure of a subroutine "resonance point detecting operation" according to the second embodiment.

In the subroutine "resonance point detecting operation" shown in FIG. 13A, moreover, resonance frequencies for the aforesaid two modes, the vibration mode 1 and the vibration mode 2, are detected first.

Since the range for the presence of resonance frequencies can be estimated according to the properties (e.g., shape, composition, supporting method, etc.) of the glass, vibration within this range should be applied to the glass plate as the resonance point is detected. Otherwise, the detecting operation may take unnecessarily long time. If the range of detection is not supposed, moreover, there is a possibility of resonance frequencies in other high-order resonance modes than an intended vibration mode being detected.

According to the present embodiment, therefore, necessary parameters for the resonance frequency detecting operation are previously stored in the EEPROM 129 that has a plurality of regions shown in the memory map of FIG. 16, and are used as "control parameters for vibration mode 1", for example. The details of the control parameter values corresponding to the vibration mode 1 are stored as the values illustrated in FIG. 20A. For example, the StartOffset represents the readout start position of this table.

Likewise, the details of control parallel values corresponding to the vibration mode 1 are stored as the values illustrated in FIG. 18A as the "frequency correction table for vibration mode 1". This data table shows values that are set in the N-ary counter 41 as the glass is driven in the vibration mode 1. This table is calculated on the supposition that the clock generator 55 outputs pulse signals with a frequency of 40 (MHz). The driving frequency can be calculated by the use of the aforementioned expression (1).

The StopOffset represents the readout end position of this frequency correction table for vibration mode 1. If the driving frequency is shifted within the range from the StartOffset to the StopOffset, the glass plate vibrates with any of the table values in the vibration mode 1.

StepTime represents the time during which one frequency should be used for the drive as the driving frequency is shifted. It is settled in consideration of the warm-up time of the dust-off glass drive circuit 140. The vibration of the glass plate never immediately catches up the change of the driving frequency. The output of the monitor signals is not reliable if the change is not caught up.

ADwait is a parameter that determines the frequency with which the monitor signals are A/D converted. M1OscTime represents a time during which the dust-off glass 21 is vibrated with the detected frequency. This is need in the subroutine "dust-off operation".

These are control parameters for the vibration mode 1.

On the other hand, the details of control parameters for vibration mode 2 are shown in FIG. 20B. Further, the details of the frequency correction table for vibration mode 2 are shown in FIG. 18B. These are parameters that are arranged in the same manner and are basically the same as those for the vibration mode 1, so that a description of them is omitted.

Further, steps of procedure for the "resonance point detecting operation" will be described with reference to the flowchart of FIG. 13A and FIGS. 16 to 18.

In S100, the four control parameters (StartOffset, StopOffset, StepTime, and ADwait) are read from the EEPROM 129. In S101, AddressM1+StartOffset is set as a readout start address of the EEPROM 129, and AddressM1+StopOffset is set as a readout end address. AddressM1 represents the top address of the frequency correction table for vibration mode 1.

If the readout start position (StartOffset) and the start end position (StopOffset) are "3" and "9", respectively, preset values "N" for regions *1 to *2 in FIG. 18A are set in the N-ary counter 41. Thus, among the frequencies f1, f2, . . . , f7, that frequency which corresponds to the maximum monitor signal output is detected.

In S102, "0", the minimum value of the monitor signals, is set for convenience' sake in a memory D_ADMAX that is secured for temporary storage of the maximum value of monitor signals.

In S103, preparatory operation for the drive of the piezoelectric element 22 is carried out. The IO port P_PwCont is controlled to turn on the transistor Q00. Further, delivery of pulse signals from the clock generator 55 is started. If data fetched from the tables are set in the N-ary counter 41 in this state, the piezoelectric element 22 can be driven with a desired frequency.

In S104, a preset value (N) is read from the set address of the EEPROM 129. Then, the preset value read out to the N-ary counter 41 is set through the IO port D_NCnt.

Then, in S105, stabilization of a frequency drive circuit is awaited for a given time.

In S106, Steptime is set in a timer counter 1, whereupon counting operation of a timer is started. If Steptime is stored, as shown in FIG. 20A, for example, 2 (msec) is set in the timer counter 1.

In S107, S is set in a memory region D_ADSUM that is secured for temporary storage of addition data for the A/D converter 60. Further, "0" is set in a memory D_ADcount that is secured to count the number of times of operation of the A/D converter 60.

In S108, the ADwait is set in a timer counter 2, whereupon counting operation is started. If the ADwait is stored, as shown in FIG. 20A, for example, 80 (μsec) is set in the timer counter 2.

Then, in S109, an A/D conversion value of the monitor signals is acquired by using the A/D converter 60.

In S110, the A/D conversion value of the monitor signals is added to the memory region D_ADSUM. Further, the memory region D_ADcount is incremented (1 is added). In S111, termination of the counting operation of the timer counter 2 is awaited.

In S112, whether or not the counting operation of the timer counter 1 is finished is determined. If this operation is not finished, the program goes to S108 for another measurement of the monitor signals. If the operation is finished, the program advances to S113.

In S113, an average of the A/D conversion values is obtained from the memory regions D_ADSUM and D_ADcount. Then, the average value is loaded into a memory region D_ADAVE that is secured to record the average value. The D_ADAVE indicates the level of the monitor signals with the present driving frequency.

In S114, the respective contents of the D_ADAVE and the D_ADMAX are compared. If the content of the D_ADAVE is greater than the content of the D_ADMAX, the program advances to S115. If the former is smaller, the program advances to S119.

In S115, the content of the D_ADAVE is transferred to the D_ADMAX, the program. The past maximum value is canceled, and the last measured value is stored as the maximum value of the monitor signals.

If the monitor signals are being currently measured in the vibration mode 1, the program advances from S116 to S117. If the monitor signals are being currently measured in the vibration mode 2, the program advances from S116 to S118.

In S117, the present address of the EEPROM 129 is stored in a D_M1resonant. The D_M1resonant is a region that is secured on the memory in order to store an address for the vibration mode 1.

In S118, moreover, the present address of the EEPROM is stored in a D_M2resonant. The D_M2resonant is a region that is secured on the memory in order to store an address for the vibration mode 2.

The respective values of the D_M1resonant and the D_M2resonant are used in the subroutine "dust-off operation", which will be described later.

In S119, whether or not the measurement of the monitor signals to the driving frequency indicated by the EEPROM readout end address is finished is determined. If it is not finished, the program advances to S121. If it is finished, the program advances to the next step or S120.

In S120, processing for stopping driving operation is carried out. The transistor Q00 is turned off to stop the operation of the clock generator.

In S121, the readout address of the EEPROM 129 is incremented, whereupon the program advances to S104.

In S122, whether or not resonance point detecting operations for the vibration mode 1 and the vibration mode 2 is finished is determined. If both the detecting operations are finished, the program returns to the main routine.

If only the vibration mode 1 is finished, the program advances to S130 to detect the resonance frequency for the vibration mode 2. Since the operations in S130 and S131 are basically the same as the aforementioned operations of S100 and S101, a description of them is omitted. Then, the program returns to S102 to detect the resonance frequency.

In this subroutine, preset values are read from a frequency correction table within a range defined by to parameters (StartOffset and StopOffset). The glass plate is driven to measure the monitor signal level by using all these preset values.

As mentioned before, FIG. 19 is a graph showing the relation between the frequency and the amplitude of the glass plate. The symbol *3 that indicates curve in this graph is supposed to represent a characteristic in a resonance mode 1.

In this routine, the monitor signal level is measured with the frequencies (preset values) f1, f2, f3, ... f7 illustrated in FIG. 18A. The resonance frequency obtained with the characteristic *3 is fc, which is equivalent to f4. In the routine, the driving frequency is changed in the order of f1, f2, f3 and f4 as the monitor signals are measured. If the resonance frequency fc is exceeded, the drive is continued with f5, f6 and f7 in the order named. The monitor signals tend to increase with f1 to f4. The monitor signals start to decrease with f5. If the change from the increase to the decrease of the monitor signals is detected, therefore, the frequencies f6 and f7 need not positively be used for the drive. If the range of change of the frequency is wide, it is to be desired that the control program should be prepared in the manner illustrated, in order to shorten the resonance frequency detection time.

Figure 12B:
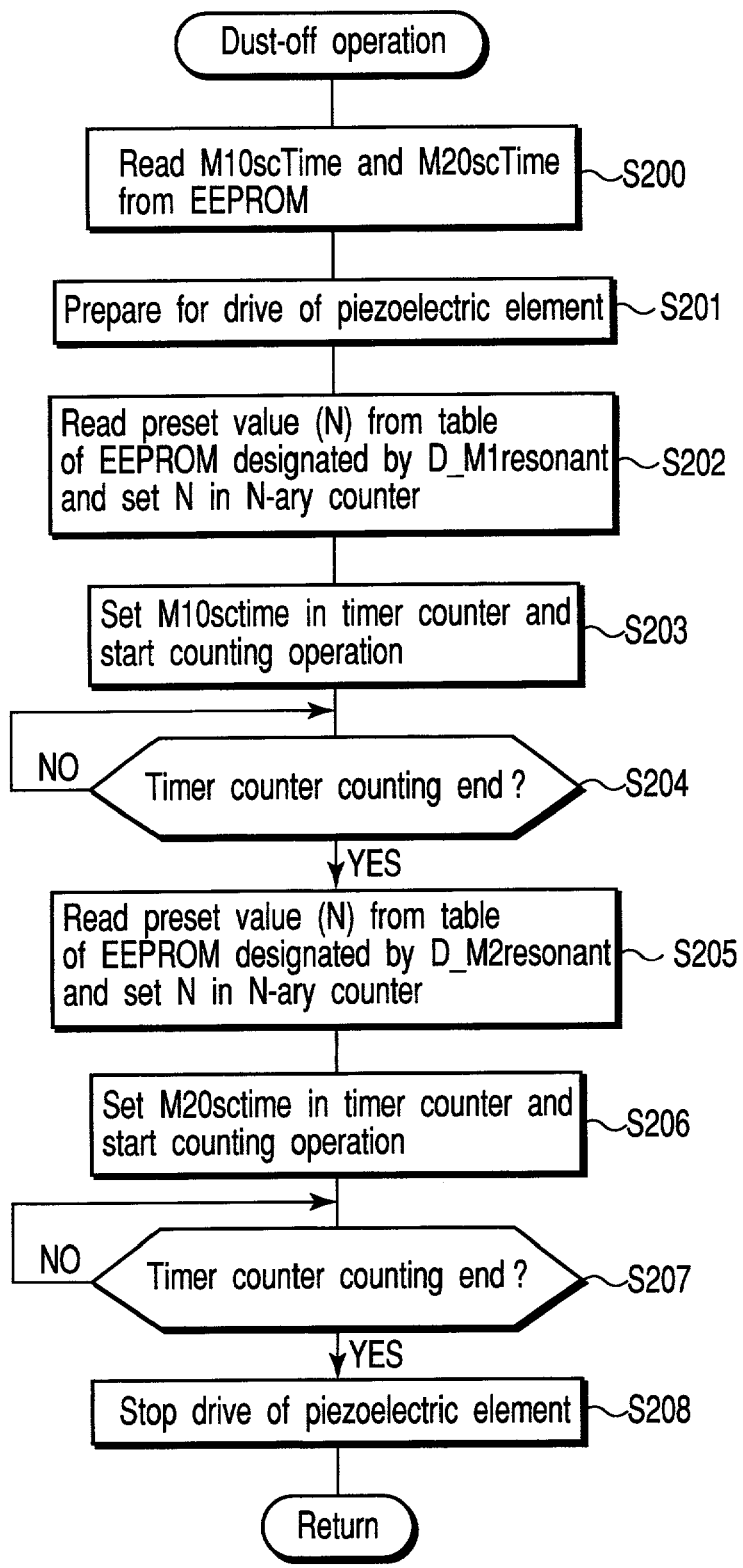
FIG. 12B is a flowchart illustrating in detail steps of procedure of a subroutine "dust-off operation" according to the second embodiment.

The following is a description of the subroutine "dust-off operation" shown in FIG. 12B.

In this subroutine, the piezoelectric element 22 is set to be driven so that the dust-off glass 21 is resonated in the aforesaid two modes, the vibration mode 1 and the vibration mode 2. In general, the frequency and amplitude that facilitate the removal of dust vary depending on the properties (e.g., weight, shape, material, etc.) of the dust. Therefore, the dust can be securely removed by resonating the glass plate in these two vibration modes. Naturally, the glass plate may be resonated in an additional number of vibration modes. Since the removal operation may correspondingly take more time in some cases, however, a suitable number of vibration modes should be set fully in consideration of the degree of the removal effect and the required time.

First, in S200, M1OSCtime and M2OSCtime are read from the control parameters for vibration mode 1 and the control parameters for vibration mode 2, respectively, of the EEPROM 129.

In S201, preparatory operation for the drive of the piezoelectric element 22 is carried out. The IO port P_PwCont is controlled to turn on the transistor Q00. Further, delivery of pulse signals from the clock generator 55 is started. If data fetched from the tables of the EEPROM are set in the N-ary counter 41 in this state, the piezoelectric element 22 can be driven with a desired frequency.

In S202, a preset value (N) is read from the address of the EEPROM that is indicated by the D_M1resonant. This value N is set in the N-ary counter 41. Thus, the dust-off glass drive circuit 140 drives the glass plate with the resonance frequency for the vibration mode 1.

In S203, the M1Osctime is set in the timer counter 1, whereupon counting operation is started. If the M1Osctime is stored, as shown in the table of FIG. 20A, for example, 200 (msec) is set in the timer counter 1.

In S204, termination of the counting operation of the timer counter 1 is awaited.

In this manner, the dusting operation of in the vibration mode 1 is completed. For secure dusting, moreover, the glass plate is vibrated in the vibration mode 2.

In S205, a preset value (N) is read from the address of the EEPROM that is indicated by the D_M2resonant. This value N is set in the N-ary counter 41. Thus, the dust-off glass drive circuit 140 drives the glass plate with the resonance frequency for the vibration mode 2.

In S206, the M2Osctime is set in the timer counter 2, whereupon counting operation is started. If the M2Osctime is stored, as shown in the table of FIG. 20B, for example, 100 (msec) is set in the timer counter 2.

In S207, termination of the counting operation of the timer counter 2 is awaited.

In S208, processing for stopping driving operation is carried out. The transistor Q00 is turned off to stop the operation of the clock generator 55.

Thereafter, the program returns to the main routine.

In the stage of designing the camera system, it is very hard to estimate the variation of the resonance frequency of the glass plate. Accordingly, the camera system should be designed so that the control parameters that settle the driving frequency of the piezoelectric element 22 can be after it is completed. As mentioned before, therefore, all the necessary parameters are selectively stored in the EEPROM 129.

In this subroutine, the glass plate is driven with only the resonance frequency that is detected in the aforesaid subroutine "resonance point detecting operation".

The characteristic obtained when this subroutine "resonance point detecting operation" is being executed is represented by *3. Further, the resonance frequency fc is regarded as equivalent to f4 in FIG. 18A. Possibly, however, the resonance frequency may fluctuate in the manner indicated by *4 and *5, owing to an unexpected factor. In order to cope with this fluctuation, therefore, data for f3 and f5, besides f4, may be read from the tables of the EEPROM 129 as this subroutine is executed.

Since the resonance frequency fluctuates within a certain range depending on temperature, moreover, the glass plate may be driven with the most suitable resonance frequency for the working temperature by properly setting a temperature correction table that is prepared according to a specified experiment and keeping it referable. To attain this, parameters corresponding to the then temperature are read from the temperature correction table corresponding to the vibration mode, it is necessary only that temperature information (t) be detected by means of the temperature sensor (not shown) of the temperature measuring circuit 33 before the execution of this subroutine.

Thus, the optical apparatus (camera 1) having dust-off function according to the second embodiment comprises the image-pickup element 27 that constitutes a CCD unit for photoelectrically converting the subject image, the optical element (dust-off glass 21) located between the image-pickup element 27 and the photographing optical system 12a, and the vibrating means (e.g., piezoelectric element 22) for vibrating the dust-off glass 21 with a given frequency, all these elements being held in a frame in the form of a case. The configuration has the first piezoelectric element including the electrode A and the second piezoelectric element including the electrode B61 that outputs the signal corresponding to the state of vibration of the optical element. Practically, in the case of this example, however, only the one piezoelectric element 22 is essential.

The optical apparatus having dust-off function is constructed in the aforesaid manner, comprising the drive means (dust-off glass drive circuit 140) that functionally has a first drive mode (vibration mode 1) in which the first piezoelectric element is vibrated with a plurality of alternative frequencies so that the resonance frequency for the resonant state of the dust-off glass 21 is determined by the output of the second piezoelectric element and a second drive mode (vibration mode 2) in which the dust-off glass 21 is driven with the resonance frequency settled in the first drive mode.

When the piezoelectric element 22 vibrates the dust-off glass 21 by means of the dust-off glass drive circuit 140, the frequency of the vibration is suitably controlled to be changed gradually.

In this case, in particular, the voltage of the electrode B that is connected to a detection circuit is initially monitored as the piezoelectric element 22 that has the two electrodes A and B61 is driven in response to a signal with a given period. After resonance detecting operation is executed such that a resonance frequency with which the dust-off glass 21 is effectively resonated is obtained as the most efficient resonance frequency, the piezoelectric element 22 is controlled to be driven in earnest with the obtained resonance frequency.

Thus, the surface of the dust-off glass 21 is efficiently resonated with the aforesaid resonance frequency in the same phase or diametrically opposite phases, so that dust adhering to the glass surface can be removed more effectively.

Thus, there may be provided a camera in which dust can be efficiently removed only in consideration of the measured ambient temperature without adjusting, for example, variations in the glass shape and the modulus of elasticity that influence the resonance frequency of the dust-off glass 21 as a protective glass.

Further, labor and cost for the adjustment of the undamped natural frequency, attributable to the variation of a glass member such as a protective glass whose resonance frequency cannot be specified, are unnecessary.

In the aforesaid second mode, the dust-off glass 21 is driven with the resonance frequency at is settled in the first mode. In consideration of the stability of vibration, however, it is not always advisable to vibrate the glass with the resonance frequency. In the second mode, in this case, it is necessary only that another frequency approximate to the resonance frequency be set in accordance with the resonance frequency settled in the first mode and the oscillation frequency be scanned within a given range including the resonance frequency.

(Modification 2)

Figure 21B:
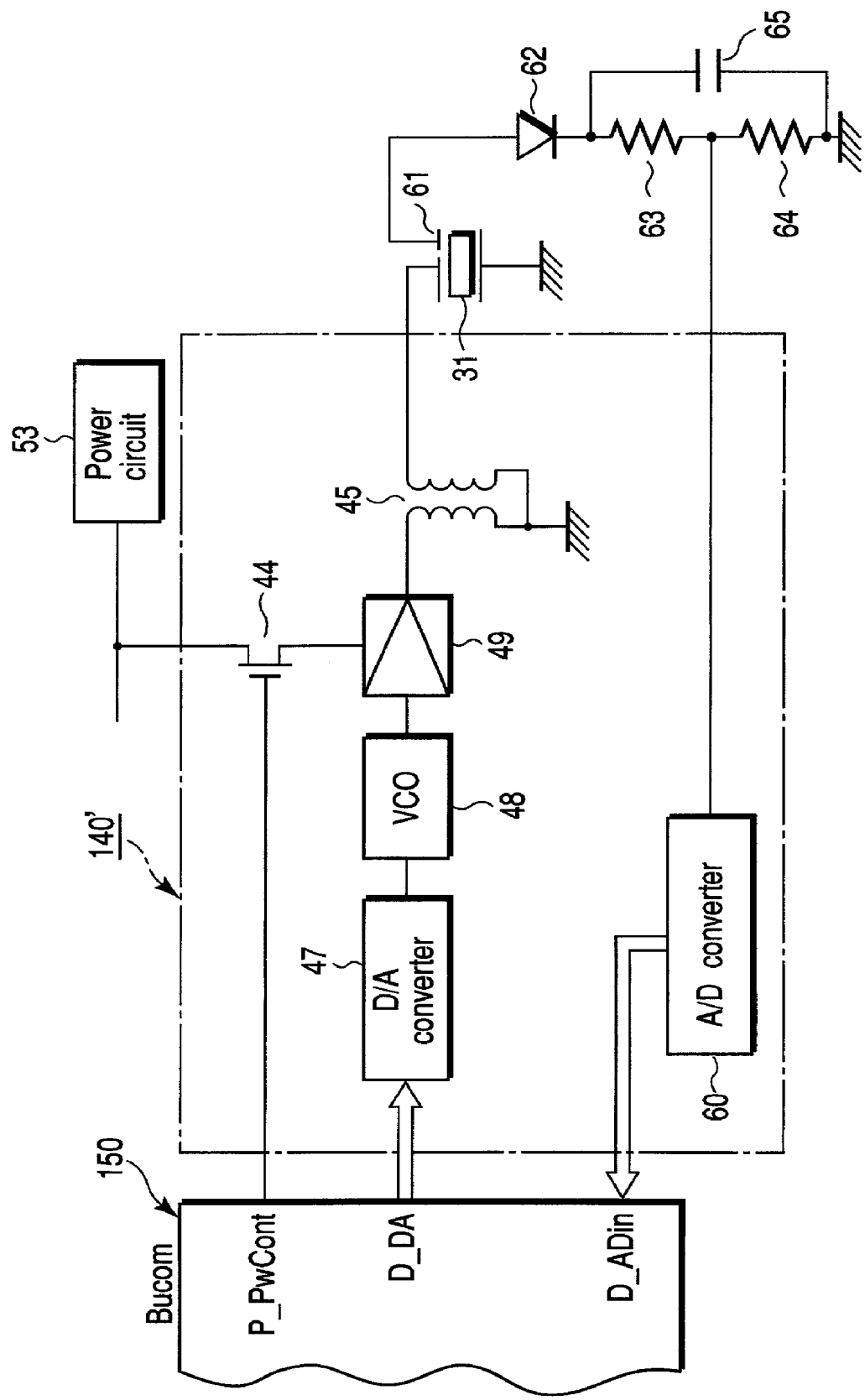
FIG. 21B is a circuit diagram showing a circuit configuration of vibrating means (dust-off glass drive circuit) as a modification of the second embodiment.

The following is a description of a modification of the second embodiment of the present invention. The foregoing second embodiment may be carried out in the following manner. A circuit diagram illustrated in FIG. 21B shows a configuration of vibrating means (dust-off glass drive circuit 140'). The following is a description of characteristic portions. The foregoing second embodiment is carried out in a manner such that the driving frequency is changed by controlling the dividing ratio of the N-ary counter 41. According to this modification, in contrast with this, the dust-off glass drive circuit 140' is constructed in the manner shown in FIG. 21B. This modification is carried out in a manner such that the driving frequency is changed by the use of the D/A converter 47 and a VCO (voltage control oscillator) 48.

As illustrated, the dust-off glass drive circuit 140' comprises the D/A converter 47 connected to an output port D_DA of the Bucom 150, the VCO (voltage control oscillator) 48 connected to the converter 47, an amplifier 49 connected to the VCO 48, and a transistor 44 and the transformer 45 connected to the amplifier 49. The base of the transistor 44 is connected to an output port P_PWCont of the Bucom 150, and necessary electric power is supplied from the power circuit 153. The piezoelectric element 22 is connected to the transformer 45 so that the glass plate can be vibrated with predetermined vibration.

Naturally, in this case, the piezoelectric element 22 is also used having the electrodes A and B. The voltage of the electrode B that is connected to a detection circuit is initially monitored as the piezoelectric element is driven. After resonance detecting operation is executed such that a resonance frequency with which the dust-off glass 21 is effectively resonated is obtained as the most efficient resonance frequency, the piezoelectric element 22 is controlled to be driven in earnest with the obtained resonance frequency.

Thus, in this configuration of the dust-off glass drive circuit 140', a signal given from the output port D DA is converted into an analog signal by means of the D/A converter 47, and a signal with a given period is oscillated by means of the VCO (voltage control oscillator) 48 in response to the converted signal. After this signal is amplified by means of the amplifier 49, the piezoelectric element 22 is vibrated with the driving frequency fc (fn) by means of a secondary-side voltage that is obtained by supplying the amplified signal to the primary side of the transformer 45. Since the driving frequency fc can be changed within the range from fc' to fc" shown in FIG. 19 by suitably changing the preset value of the D/A converter 47, the same control of the foregoing embodiment can be effected. Thus, there may be provided a camera in which dust can be removed efficiently.

Although there have been described the camera system capable of electronic image-pickup and the protective glass (dust-off glass) by way of example, the present invention can be also applied to any other optical apparatuses that can be easily damaged by dust or dirt with the same effects as those of the foregoing embodiment.

Further, any other optical element members than glass whose resonance frequency cannot be specified is applicable. Also in this case, adjustment of the undamped natural frequency attributable to the variation of individual products is unnecessary, so that the same effect as aforesaid can be expected.

(Third Embodiment)

An optical apparatus (digital camera) having dust-off function according to a third embodiment of the present invention has an additional function capable of detecting something abnormal about the dust-off function. However, it is a camera that is constructed basically in the same manner as the second embodiment described above. More specifically, a dust-off glass drive circuit 140 has a circuit configuration that is basically the same as the one shown in FIG. 9B, and signals (Sig1 to Sig6) with the waveforms represented by the time charts of FIGS. 10A to 10F are generated in its various parts. The circuit 140 is controlled in response to these signals in the following manner.

Control that is executed by means of a camera body control microcomputer (Bucom) 150 according to the third embodiment will be described specifically with reference to the main routine of the control program illustrated in the flowcharts of FIGS. 11C and 11D.

When the power SW (not shown) of the camera 1 is first turned on, the Bucom 150 starts to operate, and a process for starting (booting) the camera system is executed in S0. The power circuit 153 is controlled to supply electric power to the individual circuit units that constitute the camera system, and the individual circuits are initialized.

In S1 a subroutine "resonance point detecting operation" is called and executed. In this subroutine, a suitable driving frequency (resonance frequency) for efficient vibration of the dust-off glass 21 is detected. This frequency data is stored in a memory region with a given address of the Bucom 150. Thus, the resonance point detecting operation (S1) is during the starting (booting) of the camera system (S0).

In S2, a subroutine "dust-off operation" is called and executed. During this subroutine, the user can remove dust, having unexpectedly adhered to the dust-off glass 21 while the camera 1 is not used for photographing, by vibrating the dust-off glass 21 with the resonance frequency detected in S1 and shaking off the dust adhering to the glass surface of the piezoelectric element 22.

S3 is a step that is executed cyclically, and is an operating step for detecting the state of the lens barrel 12 through operation for communication between the Bucom 150 and the Lucom 205. If it is detected in S4 that the lens barrel 12 is attached to the camera body 11, the program advances to S7.

If it is detected that the lens barrel 12 is detached from the camera body 11, on the other hand, the program advances from S5 to S6, whereupon a control flag F_Lens is reset, and thereafter, the program advances to S10.

If the attachment of the lens barrel 12 to the camera body 11 is not detected in S4, the control flag F_Lens is set in S7. This control flag represents "1" during a period in which the lens barrel 12 is attached to the camera body 11 and represents "0" during a period in which the lens barrel 12 is detached.

The subroutine "resonance point detecting operation" is called and executed in the same manner as aforesaid in S8, and the subroutine "dust-off operation" for removing dust from the dust-off glass 21 is called and executed in the same manner as aforesaid in the directly subsequent step or S9.

Usually, as mentioned before, dust adheres to the lenses, dust-off glass 21, etc. with high possibility during the period in which the lens barrel 12 is not attached to the camera body 11. It is to be desired, therefore, that dusting operation should be executed when the attachment of the lens barrel 12 is detected. If the lenses are replaced, the outside air circulates in the camera 1 and changes the temperature in the camera, whereupon the resonance frequency of the glass also changes. In S8, therefore, the aforesaid subroutine "resonance point detecting operation" is executed to settle a new driving frequency (resonance frequency).

Then, in the directly subsequent step or S9, the subroutine "dust-off operation" is executed with the frequency settled in S8.

The state of the camera operating SW 152 is detected in S10. If change of the state of a CleanUp-SW (not shown) as one element of the camera operating SW 152 is detected in the next step or S110, the program advances to S12.

After operation for detecting the resonance point is executed in S12, operation for removing dust from the dust-off glass 21 is executed in S13. In this case, operation for fetching CCD (image-pickup element) pixel defect information is executed in S13 in association with the operation of S12. This defective pixel information is stored in the FlashRom 126 and used for the correction of image data. If dust adheres to the glass, however, accurate defect information cannot be obtained.

Prior to the operation of S131, therefore, a series of operations of S12 and S13 is executed in the same manner as aforesaid.

In S14, whether or not a 1st release SW (not shown) as one element of the camera operating SW 152 is operated is determined. If the 1st release SW is on, the program advances to S15. If it is off, the program returns to S3 described above.

When luminance information on the subject is obtained from the photometric circuit 21 in S15, an exposure time (Tv-value) of the image-pickup element 27 and a preset aperture value (Av-value) of the photographing optical system 12*a* are calculated according to this luminance information.

When detection data on the AF sensor unit 116 is obtained via the AF sensor drive circuit 117 in S16, a deviation of the focal point is calculated in accordance with this detection data.

Then, in S17, the state of the control flag F_Lens is determined. If the state is "0", then it implies that the lens barrel 12 is not present, so that the photographing operation in the next step or S18 and the subsequent steps cannot be executed. In this case, therefore, the program returns to S3 described above.

In S18, the deviation of the focal point is transmitted to the Lucom 205, and the drive of the photographing optical system 12*a* based on this deviation is ordered.

In S19, whether or not a 2nd release SW (not shown) as one element of the camera operating SW 152 is operated is determined. If the 2nd release SW is on, the program advances to the next step or S19, whereupon predetermined photographing operation is carried out. If it is off, the program returns to S3 described above.

In S19, the "dust-off operation" routine is executed to remove dust before the photographing operation. In order to avoid a time lag attributable to the execution of this dust-off operation, however, the "resonance point detecting operation" routine is not executed in this case.

For secure dusting, it is to be desired that the operations based on these two routines should be executed jointly. If there is no possibility of the resonance frequency changing, however, the "resonance point detecting operation" routine may be omitted as a matter of course. However, this does not apply to cases for the starting of the camera system, lens replacement, and CCD (image-pickup element) pixel defect detecting operation.

In S20, the Av-value is first transmitted to the Lucom 205, and the drive of the stop 203 is ordered. In S21, the reflector (quick-return mirror) 13*b* is moved to its up position.

After a front-blind run of the shutter 14 is started in S22, the image processing controller 128 is ordered to execute the photographing operation in the next step or S23. When exposure of the image-pickup element 27 for the time represented by the Tv-value is finished, a rear-blind run of the shutter 14 is started in the next step or S24. Thereafter, the reflector 13*b* is driven to its down position in S25, and the shutter 14 is charged in parallel with this.

In S26, the Lucom 205 is ordered to restore the stop 203 to its open position. In the next step or S27, the image processing controller 128 is ordered to record the photographed image data in the recording media 127. When recording the image data is finished, the program returns to S3 described above.

The details of the subroutine "dust-off operation" will be described as a feature of the third embodiment with reference to the flowchart of FIG. 12C. In this subroutine, the piezoelectric element 22 is drivingly controlled so that the dust-off glass 21 is resonated.

First, in S200, whether or not an operation disable flag is set in the EEPROM 129 is determined, as mentioned later. This operation disable flag is set if no proper resonance point is detected, that is, if it is concluded that there is something abnormal about the dust-off mechanism, in the aforesaid "resonance point detecting operation" of S1 of FIG. 11C (which will be described in detail later). If this operation disable flag is set, no dust-off operation is executed, and the program returns directly to the monitor routine.

If the operation disable flag is not set, on the other hand, preparatory operation for the drive of the piezoelectric element 22 is carried out in S201. This is an operation such that the IO port P_PwCont is controlled to turn on the transistor QOD and delivery of pulse signals from the clock generator 55 is started.

In S202, a preset value (N) related to the resonance frequency of the dust-off glass 21 that is detected in the aforesaid "resonance point detecting operation" of S1 of FIG. 11C is read out. As this read value is set in the N-ary counter 41, the dust-off glass drive circuit 140 drives the dust-off glass 21 with that resonance frequency.

In S203, data corresponding to 100 msec is set in the timer counter 1, whereupon counting operation is started.

In S204, termination of the counting operation of the timer counter 1 is awaited. Then, in S205, processing for stopping driving operation is carried out, whereupon the transistor Q00 is turned off to stop the operation of the clock generator 55. Thereafter, the program returns to the main routine.

Figure 13B:
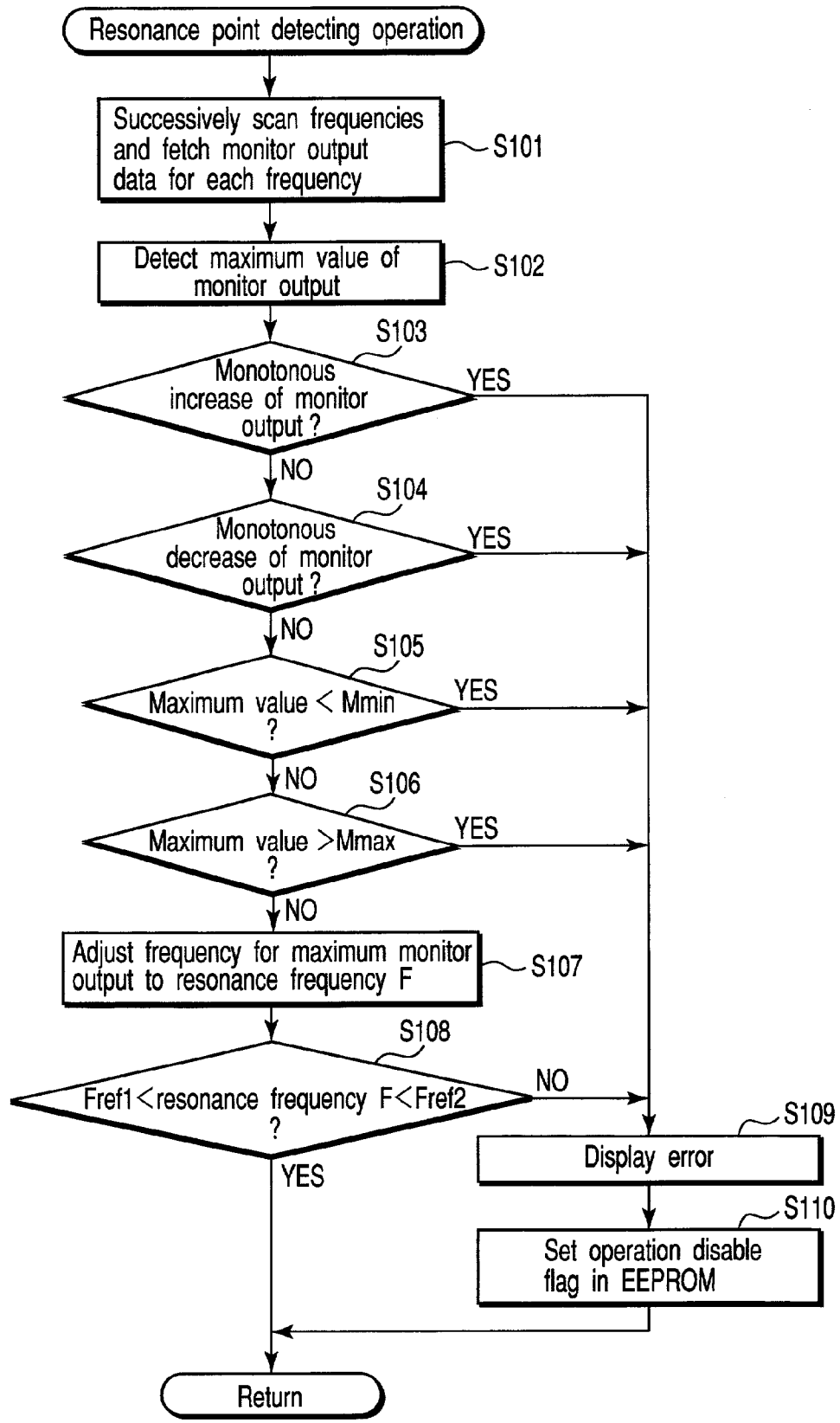
FIG. 13B is a flowchart illustrating in detail steps of procedure of a subroutine "resonance point detecting operation" according to the third embodiment.

The details of the subroutine "resonance point detecting operation" according to the third embodiment will now be described with reference to the flowchart of FIG. 13B.

As is generally known, the resonance frequency of the dust-off glass 21 varies depending on the shape, material, supporting method, and vibration mode (vibration form) of the glass plate. If dust-off glasses are mass-produced as protective glasses, moreover, the resonance frequency also varies owing to dispersion of working accuracy. Thus, the dispersion can be canceled by measuring the resonance frequency of each individual dust-off glass 21 and suitably adjusting the frequency of the oscillator that applies voltage to the piezoelectric element 22 during operation.

In this subroutine "resonance point detecting operation", operation for detecting the resonance frequency (resonance point) for dust-off operation is executed. In this subroutine, moreover, something abnormal about the dust-off mechanism including the dust-off glass 21 can be detected.

Figures 25, 26:
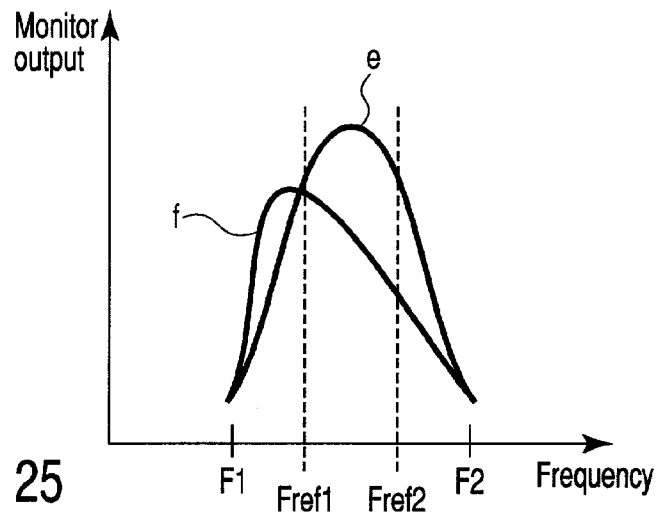
FIG. 25 is a graph illustrating an example that constitutes the basis of verification for preventing a situation such that correct vibration cannot be applied owing to something abnormal about the dust-off mechanism in the camera having dust-off function according to the third embodiment.
FIG. 26 is a list in the form of a table showing preset values set in an N-ary counter of the camera having dust-off function according to the third embodiment.

First, in S101, the driving frequency of the piezoelectric element 22 is gradually changed, that is, the preset value set in the N-ary counter 41 is changed for each given time from a minimum value, 493, to a maximum value, 507, which are tabulated in FIG. 26, as the monitor signal (Sig6 on the time chart of FIG. 10F) with each individual driving frequency is detected by means of the A/D converter 60. The resulting data are loaded into predetermined memory regions in regular order.

For convenience' sake, in this case, a driving frequency of 40.57 Hz corresponding to the minimum preset value, 493, tabulated in FIG. 26 is called "F1", and a driving frequency of 39.45 Hz corresponding to the maximum preset value, 507, is called "F2".

In S102, a maximum value of the monitor signal data stored in the predetermined memory regions is detected.

Figure 22:
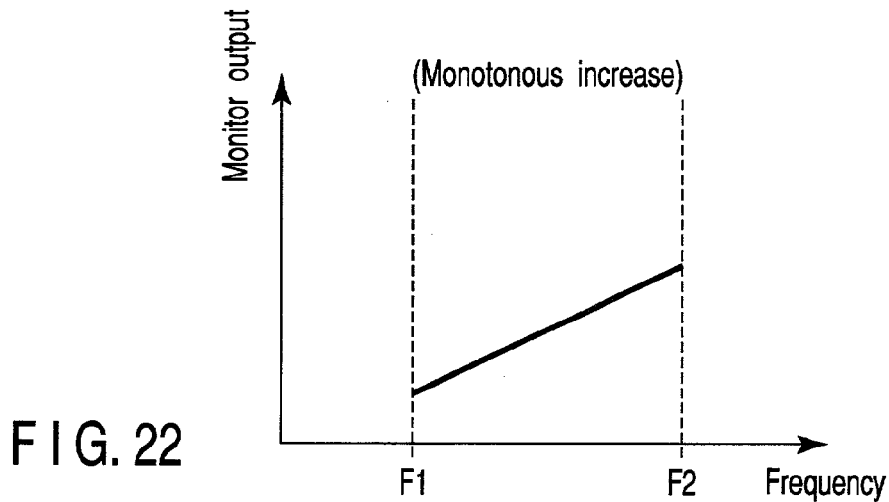
FIG. 22 is a graph showing the case of a monotonous increase pattern for the relation between the driving frequency and the monitor output signal level in the camera having dust-off function according to the third embodiment.
Figure 23:
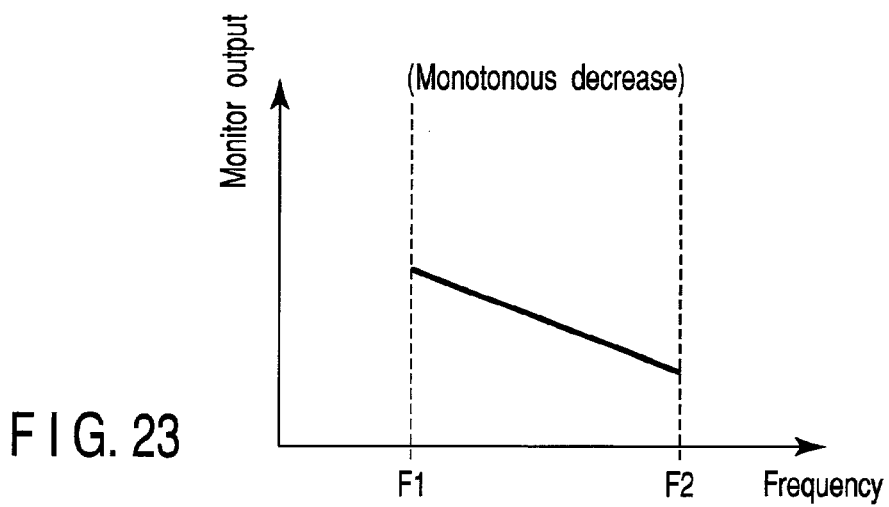
FIG. 23 is a graph showing the case of a monotonous decrease pattern for the relation between the driving frequency and the monitor output signal level in the camera having dust-off function according to the third embodiment.

In general, the monitor signal should have its peak in the vicinity of the resonance frequency of the dust-off glass 21 if the dust-off mechanism has no problem (such as abnormality or trouble). If there is anything abnormal about the dust-off mechanism, however, no peak can be found out as the driving frequency is gradually shifted from F1 to F2, in some cases. These cases include the case of a monotonous increase pattern shown in FIG. 22 and the case of a monotonous decrease pattern shown in FIG. 23. These drawings are graphs having axes of abscissa and ordinate that represent the driving frequency and the monitor output signal level, respectively, for example.

Thus, if there is a general tendency toward a monotonous increase or decrease when the respective monitor output signal levels of the individual driving frequencies are compared in S102 described above, it can be concluded that the dust-off mechanism is abnormal.

In S103, whether or not the monitor output signal level increases monotonously. If a monotonous increase is detected, the program advances to abnormal-state processing of S109 and its subsequent steps.

In S104, moreover, whether or not the monitor output signal level decreases monotonously. If a monotonous decrease is detected, the program advances to the abnormal-state processing of S109 and its subsequent steps in the same manner as aforesaid. If the monitor output signal level neither increases nor decreases monotonously, that is, if there is a peak (resonance point) of the monitor output signal halfway between the aforesaid frequencies F1 and F2, the program advances to S105, whereupon the monitor output signal level is determined.

If this monitor output signal level is not within a given range, the dust-off mechanism can be regarded as abnormal.

Figure 24:
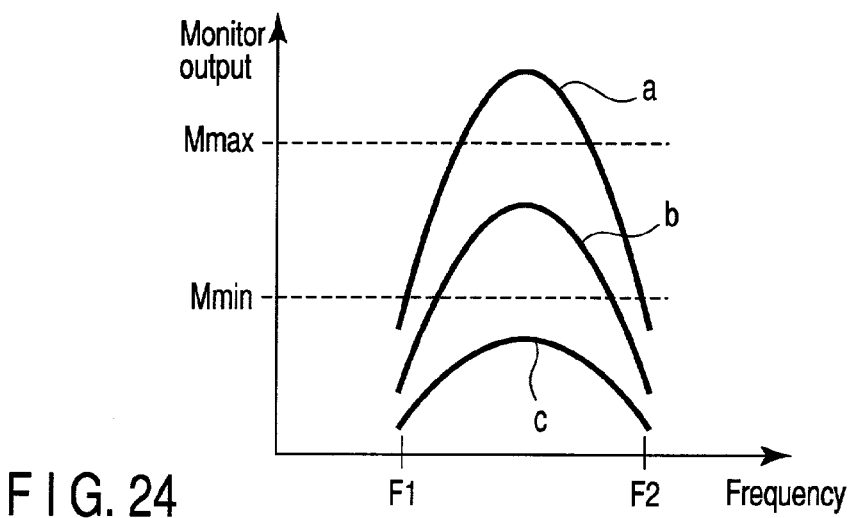
FIG. 24 is a graph illustrating cases where a dust-off mechanism can be concluded to be abnormal if the monitor output signal level is not within a given range, in the camera having dust-off function according to the third embodiment.

FIG. 24 shows a graph that illustrates cases where the dust-off mechanism can be concluded to be abnormal if the monitor output signal level is not within the given range, in the camera having dust-off function according to the third embodiment of the present invention.

In FIG. 24, the respective maximum values (peak values) of curves a and c, out of three curves a, b and c given by way of example, are not within the range from Mmin to Mmax, so that it can be concluded that there is something abnormal about the dust-off mechanism. If it is concluded in S105 that the maximum value of the monitor signal output is smaller than Mmin, therefore, the program advances to the abnormal-state processing of S109 and its subsequent steps.

If it is concluded in S106 that the maximum value of the monitor signal output is greater than Mmax, therefore, the program also advances to the abnormal-state processing of S109 and its subsequent steps in the same manner as aforesaid.

If it is concluded in S105 and S106 that the monitor signal level is within the given range, the program advances to S107, whereupon the driving frequency for the maximum value of the monitor output signal is set to be a resonance frequency F.

If the maximum value between the driving frequencies F1 and F2, if any, is deviated considerably from a design value, there is something abnormal about the dust-off mechanism, so that correct vibration sometimes cannot be applied. To prevent this situation, therefore, the resonance frequency F is further verified in S108.

FIG. 25 shows a graph illustrating an example that constitutes the basis of the verification for preventing the situation in which correct vibration cannot be applied owing to something abnormal about the dust-off mechanism in the camera having dust-off function. Out of two curves e and f shown in FIG. 25, for example, curve e represents a normal characteristic, while curve f has its peak position extremely inclined toward F1, suggesting something abnormal about the dust-off mechanism.

In S108 described above, therefore, the dust-off mechanism is concluded to be abnormal if the peak-position frequency (resonance frequency) is not within a given range (Fref1 to Fref2), whereupon the program advances to the abnormal-state processing of S109 and its subsequent steps.

The aforesaid decision range Mmin to Mmax for the monitor output signal and the decision range Fref1 to Fref2 for the resonance frequency involve values that are computed at the time of design, depending on the shape, material, supporting method, vibration form, etc. of the dust-off glass 21.

If no abnormality is found, the resonance frequency F is set and the main routine is restored. If anything abnormal is found, however, an error is indicated by means of a sounding member (not shown), LED, etc. in order to give warning the user in S109.

Thereafter, in S110, the operation disable flag is written and set in the EEPROM 129 to prohibit dust-off operation, whereupon the program returns to the main routine.

When the operation disable flag is written in the EEPROM 129, no dust-off operation is carried out unless repairs are made afterward in a service center or the like.

Thus, according to the third embodiment, something abnormal about the dust-off mechanism, in particular, can be easily detected by carrying out the aforesaid control in the camera or other optical apparatus that has the dust-off mechanism in which dust or the like adhering to the dust-off glass on the front face of the image-pickup element can be shaken off by vibrating the dust-off glass.

In consequence, conventional accidents can be prevented such that the dust-off mechanism is unexpectedly driven in an abnormal state, and therefore, the camera itself, as well as the dust-off mechanism, is broken inevitably.

(Other Modifications)

The present invention is applicable to any other optical apparatuses than the illustrated digital cameras. More specifically, the same effect of the present invention may be expected from any other optical apparatuses than cameras that are provided with an image-pickup element, piezoelectric element, etc. by suitably utilizing these elements.

(Effect of the Invention)

According to the optical apparatuses having dust-off function of the present invention, as described in connection with the three embodiments and their modifications herein, there may be provided an optical apparatus having dust-off function that includes a system such that the dust-off glass whose resonance frequency cannot be specified in one position can be driven efficiently. Further, there may be provided an optical apparatus having dust-off function in which trouble in its dust-off function can be detected with ease.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An optical apparatus having dust-off function, comprising:
   a photoelectric conversion element configured to convert an optical image of a subject into electric information;
   an image-pickup optical system configured to focus the optical image of said subject on a light receiving surface of said photoelectric conversion element;
   a dust-off filter located between said light receiving surface of said photoelectric conversion element and said image-pickup optical system; and
   a vibrating mechanism configured to vibrate said dust-off filter based on a signal having a frequency obtained by dividing the frequency of a reference clock, said vibrating mechanism changing a ratio of the frequency division as time passes so that the frequency of vibration waves generated in said dust-off filter changes with the passage of time.

2. An optical apparatus having dust-off function according to claim 1, wherein said vibrating mechanism vibrates said dust-off filter with a frequency approximate to a resonance frequency of said dust-off filter.

3. An optical apparatus having dust-off function according to claim 1, wherein said vibrating mechanism vibrates said dust-off filter with a plurality of frequencies including a resonance frequency of said dust-off filter.

4. An optical apparatus having dust-off function according to claim 1, wherein said vibrating mechanism gradually changes the oscillation frequency of said dust-off filter within a given range including a resonance frequency of said dust-off filter.

5. An optical apparatus having dust-off function according to claim 1, wherein said vibrating mechanism generates standing-wave vibration in said dust-off filter.

6. An optical apparatus having dust-off function according to claim 5, wherein said vibrating mechanism controls said vibrating operation in a plurality of vibration modes with different numbers of nodes of said standing-wave vibration.

7. An optical apparatus having dust-off function according to claim 6, wherein said vibrating mechanism continuously executes said plurality of vibration modes.

8. An optical apparatus having dust-off function, comprising:
   a photoelectric conversion element including a photoelectric conversion element configured to convert an optical image of a subject into electric information;
   an image-pickup optical system configured to focus an optical image of said subject on a light receiving surface of said photoelectric conversion element;
   a dust-off filter secured to said photoelectric conversion element unit so as to cover the light receiving surface of said photoelectric conversion element
   a piezoelectric element fixed circularly to an outer peripheral portion of said dust-off filter outside the area where luminous flux from said subject passes; and
   a control circuit vibrating said piezoelectric element by applying cyclic control signals to said piezoelectric element, thereby generating standing-waves in said dust-off filter,
   said control circuit sequentially changing a frequency of the control signals applied to the piezoelectric element within a given range.

9. An optical apparatus having dust-off function according to claim 8, wherein a scanning range for the frequency of the control signals applied to said piezoelectric element is set so that said dust-off filter vibrates in a frequency range including at least a specific resonance frequency of said dust-off filter.

10. An optical apparatus having dust-off function according to claim 8, which further comprises a temperature measuring circuit for measuring an ambient temperature such that a scanning range for the frequency of the control signals applied to said piezoelectric element can be shifted in accordance with a result of measurement of said temperature measuring circuit.

11. An optical apparatus having dust-off function, comprising:
    a photoelectric conversion element unit including a photoelectric conversion element configured to convert an optical image of a subject into electric information;
    an image-pickup optical system configured to focus the optical image of said subject on a light receiving surface of said photoelectric conversion element;
    a dust-oft filter secured to said photoelectric conversion element unit so as to cover the light receiving surface of said photoelectric conversion element;
    a piezoelectric element fixed circularly to an outer peripheral portion of said dust-off filter, outside the area where luminous flux from said subject passes, said piezoelectric element being adapted to vibrate when supplied with cyclic control signals, thereby generating standing-waves in said dust-off filter; and
    a control circuit configured to apply cyclic control signals to said piezoelectric element, said control circuit being capable of gradually changing a frequency of voltage signals applied to said piezoelectric element.

12. An optical apparatus having dust-off function, comprising:
    a photoelectric conversion element configured to convert an optical image of a subject into electric information;
    an image-pickup optical system configured to focus the optical image of said subject on a light, receiving surface of said photoelectric conversion element;
    a dust-off filter located between said photoelectric conversion element and said image-pickup optical system;
    a piezoelectric element fixed to an outer peripheral portion of said dust-off filter, said piezoelectric element being adapted to vibrate when supplied with cyclic control signals, thereby generating vibration waves in said dust-off filter; and
    a control circuit configured to apply cyclic control signals to said piezoelectric element, said control circuit being capable of gradually changing a frequency of voltage signals applied to said piezoelectric element,
    wherein said control circuit includes a frequency divider for dividing the frequency of basic clocks, a CPU for supplying said basic clocks to said frequency divider and setting a dividing ratio of the frequency divider, and a switching circuit for applying cyclic voltage signals to said piezoelectric element in accordance with a dividing output of said frequency divider, said CPU being capable of changing a dividing ratio set in said frequency divider with every given time.

13. An optical apparatus having dust-off function according to claim 12, wherein said CPU includes a memory stored with a plurality of dividing ratio data on said frequency divider, and data stored in said memory are successively read and set in said frequency divider with every given time.

14. An optical apparatus having dust-off function, comprising:
   image-pickup means for converting an optical image of a subject into electric information;
   an image-pickup optical system for focusing the optical image of said subject on a light receiving surface of said image-pickup means;
   an optical element located between said image-pickup means and said image-pickup optical system;
   first vibrating means for vibrating said optical element with a plurality of frequencies in succession;
   detecting means capable of monitoring a state of vibration of said optical element during vibrating operation of said first vibrating means, thereby detecting a resonance frequency of said optical element; and
   second vibrating means for vibrating said optical element with the resonance frequency detected by means of said detecting means or a frequency approximate to the resonance frequency.

15. An optical apparatus having dust-off function according to claim 14, wherein said first vibrating means includes storage means stored with a plurality of frequency data.

16. An optical apparatus having dust-off function according to claim 14, which further comprises abnormality detecting means for detecting something abnormal about said optical element or said first vibrating means in accordance with change of an output of said detecting means.

17. A camera having dust-off function, comprising:
   a photoelectric conversion element configured to convert an optical image of a subject into electric information;
   an image-pickup optical system configured to focus the optical image of said subject on a light receiving surface of said photoelectric conversion element;
   a dust-off filter located between said photoelectric conversion element and said image-pickup optical system;
   a piezoelectric element fixed to a peripheral edge portion of said dust-off filter;
   a control circuit vibrating said piezoelectric element, thereby generating vibration waves in said dust-off filter, and
   a monitor circuit configured to monitor a state of vibration of said dust-off filter,
   wherein said control circuit has a first mode in which said dust off filter is vibrated with a plurality of oscillation frequencies and a resonance frequency of said dust-off filter is detected from an output signal then delivered from said monitor circuit and a second mode in which said dust-off filter is vibrated in accordance with the resonance frequency detected in the first mode, and alternatively executes either of the modes in a period of time according to an operation of said camera.

18. A camera having dust-off function according to claim 17, wherein said control circuit executes said first mode in a first period of time and executes said second mode in a second period of time that follows said first period of time.

19. A camera having dust-off function according to claim 18, wherein said first period of time is a period of time after a booting operation of said camera.

20. A camera having dust-off function according to claim 18, wherein said first period of time is a time for an attachment of said image pickup optical system to said camera.

21. A camera having dust-off function according to claim 18, wherein said second period of time is a period of time precedent to photographing operation.

22. A camera having dust-off function according to claim 18, wherein said second period of time is a time corresponding to the operation of a manual operating member.

23. An optical apparatus having dust-off function, comprising:
   a photoelectric conversion element configured to convert an optical image of a subject into electric information;
   an image-pickup optical system configured to focus the optical image of said subject on a light receiving surface of said photoelectric conversion element;
   an optical element located between said photoelectric conversion element and said image-pickup optical system;
   a first piezoelectric element located on the outer peripheral portion of said optical element, said first piezoelectric element being adapted to vibrate when supplied with cyclic voltage signals, thereby generating vibration waves in said optical element;
   a second piezoelectric element located on an outer peripheral portion of said optical element so as to output a signal corresponding to a state of vibration of said optical element; and
   a control circuit configured to apply said cyclic voltage signals to said first piezoelectric element, said control circuit having a first mode in which a frequency of said voltage signals is changed as said first piezoelectric element is vibrated with a plurality of frequencies and a frequency for a resonant state is settled in accordance with an output of said second piezoelectric element and a second mode in which said optical element is driven with the resonance frequency settled in the first mode.

24. An optical apparatus having dust-off function according to claim 23, wherein said control circuit alternatively executes either of said first and second modes in a period of time according to an operation of said optical apparatus.

25. An optical apparatus having dust-off function according to claim 23, wherein control circuit includes a memory stored with a plurality of frequency data, and the frequency of said voltage signals is gradually changed with reference to the data stored in said memory in said first mode.

26. An optical apparatus having dust-off function according to claim 23, wherein said control circuit includes a converter for smoothing the cyclic signals delivered from said second piezoelectric element and converting the signals into digital data.

27. A camera having dust-off function, comprising:
   a photoelectric conversion element configured to convert an optical image of a subject into electric information;
   an image-pickup optical system configured to focus the optical image of said subject on a light receiving surface of said photoelectric conversion element;
   a dust-off filter located between said photoelectric conversion element and said image-pickup optical system;
   a piezoelectric element fixed to a peripheral edge portion of said dust-off filter;
   a control circuit capable of vibrating said piezoelectric element, thereby generating vibration waves in said dust-off filter, and
   a monitor circuit configured to monitor a state of vibration of said dust-off filter,
   wherein said control circuit has a resonance point detection mode in which, said dust-off filter is vibrated with a plurality of oscillation frequencies and the resonance frequency of said dust-off filter is detected from an output signal then delivered from said monitor circuit.

28. A camera having dust-off function according to claim 27, wherein said control circuit has a dusting mode in which said dust-off filter is vibrated in accordance with said detected resonance frequency.

29. An optical apparatus having dust-off function, comprising:
- image-pickup means including a photoelectric conversion element for converting an optical image of a subject into electric information;
- an image-pickup optical system for focusing the optical image of said subject on a light receiving surface of said photoelectric conversion element;
- a dust-off filter located between said photoelectric conversion element and said image-pickup optical system;
- vibrating means for vibrating said dust-off filter;
- monitoring means for monitoring a state of vibration of said dust-off filter; and
- abnormality detecting means for detecting an abnormal state of said dust-off filter or said vibrating means in accordance with an output signal from said monitoring means.

30. An optical apparatus having dust-off function according to claim 29, wherein said vibrating means vibrates said dust-off filter with a plurality of different frequencies.

31. An optical apparatus having dust-off function according to claim 29, wherein said detecting means detects something abnormal about said dust-off filter or said vibrating means in accordance with change of an output of said monitoring means caused when said dust-off filter is vibrating.

32. An optical apparatus having dust-off function, comprising:
- image-pickup means including a photoelectric conversion element configured to convert an optical image of a subject into electric information;
- an image-pickup optical system configured to focus the optical image of said subject on a light receiving surface of said photoelectric conversion element;
- a dust-off filter located between said photoelectric conversion element and said image-pickup optical system;
- a piezoelectric element located integrally on a part of said dust-off filter;
- a control circuit capable of generating vibration waves in said dust-off filter by vibrating said piezoelectric element; and
- a monitor circuit capable of monitoring a state of vibration of said dust-off filter and outputting monitor signals to said control circuit,
- wherein said control circuit successively stores the monitor signals from said monitor circuit while modifying a driving signal for driving said piezoelectric element and comparatively evaluates stored values of monitor signals after a termination of the storage, thereby determining whether or not said dust-off filter has vibrated normally.

33. An optical apparatus having dust-off function according to claim 32, wherein said control circuit concludes that the vibration is abnormal if the stored values of the monitor signals from said monitor circuit monotonously increase or monotonously decrease.

34. An optical apparatus having dust-off function according to claim 32, wherein said control circuit detects a maximum value among the stored values of the monitor signals from said monitor circuit and detects an abnormal state depending on whether or not said maximum value is within a given range.

35. An optical apparatus having dust-off function according to claim 32, wherein said control circuit detects a maximum value among the stored values of the monitor signals from said monitor circuit and detects an abnormal state depending on whether or not the frequency of the driving signal for the delivery of said maximum value is within a given range.

* * * * *